United States Patent
Otsuka et al.

(10) Patent No.: US 9,929,700 B2
(45) Date of Patent: Mar. 27, 2018

(54) DISTORTION COMPENSATION CIRCUIT

(71) Applicant: Mitsubishi Electric Corporation, Chiyoda-ku (JP)

(72) Inventors: Hiroshi Otsuka, Chiyoda-ku (JP); Yuji Komatsuzaki, Chiyoda-ku (JP); Jun Nishihara, Chiyoda-ku (JP); Hifumi Noto, Chiyoda-ku (JP); Koji Yamanaka, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/306,382

(22) PCT Filed: Apr. 24, 2015

(86) PCT No.: PCT/JP2015/062558
§ 371 (c)(1),
(2) Date: Oct. 24, 2016

(87) PCT Pub. No.: WO2015/163457
PCT Pub. Date: Oct. 29, 2015

(65) Prior Publication Data
US 2017/0047898 A1    Feb. 16, 2017

(30) Foreign Application Priority Data

Apr. 25, 2014 (JP) .................................. 2014-091508
Nov. 27, 2014 (JP) .................................. 2014-240014

(51) Int. Cl.
| | |
|---|---|
| *H03F 1/26* | (2006.01) |
| *H03F 1/32* | (2006.01) |
| *H03F 1/02* | (2006.01) |
| *H03F 1/56* | (2006.01) |
| *H03F 3/189* | (2006.01) |

(52) U.S. Cl.
CPC ................ *H03F 1/32* (2013.01); *H03F 1/02* (2013.01); *H03F 1/3241* (2013.01); *H03F 1/565* (2013.01); *H03F 3/189* (2013.01); *H03F 2200/451* (2013.01)

(58) Field of Classification Search
CPC ............. H03F 1/26; H03F 1/32; H03F 1/3241
USPC ........................................................ 330/149
See application file for complete search history.

(56) References Cited

U.S. PATENT DOCUMENTS 6,262,631 B1 * 7/2001 Li ......................... H03F 1/3276
                                                       330/149
2001/0013809 A1   8/2001 Fujiwara et al.

FOREIGN PATENT DOCUMENTS

| JP | 11-355055 A | | 12/1999 |
|---|---|---|---|
| JP | 2000252755 A | * | 9/2000 |
| JP | 2001-292039 A | | 10/2001 |
| JP | 2002084143 A | * | 3/2002 |

(Continued)

OTHER PUBLICATIONS

International Search Report dated Jun. 2, 2015 in PCT/JP15/062558 Filed Apr. 24, 2015.

*Primary Examiner* — Steven J Mottola
(74) *Attorney, Agent, or Firm* — Oblon, McClelland, Maier & Neustadt, L.L.P.

(57) ABSTRACT

A distortion compensation circuit includes a low-pass circuit to block the passage of two-wave RF signals and intermodulation distortions and to allow the passage of a difference-frequency signal. The low-pass circuit is connected between a signal path and an intermodulation distortion adjustment circuit.

23 Claims, 17 Drawing Sheets

(56) References Cited

FOREIGN PATENT DOCUMENTS

| | | |
|---|---|---|
| JP | 2004-15390 A | 1/2004 |
| JP | 2008-16966 A | 1/2008 |
| JP | 2011-182196 A | 9/2011 |

* cited by examiner

DISTORTION COMPENSATION CIRCUIT

TECHNICAL FIELD

The invention relates to a distortion compensation circuit that compensates for intermodulation distortions occurring in the amplifier by generating intermodulation distortions having opposite characteristics to the intermodulation distortions occurring in the amplifier.

BACKGROUND ART

As a method for reducing intermodulation distortions occurring in an amplifier, there is known a method where a distortion compensation circuit, which generates intermodulation distortions having opposite characteristics to intermodulation distortions occurring in the amplifier, is connected to a stage previous or subsequent to the amplifier.

The amplitude of the intermodulation distortions of the opposite characteristics generated by the distortion compensation circuit is the same as the amplitude of the intermodulation distortions occurring in the amplifier. The phase of the intermodulation distortions of the opposite characteristics is different by 180 degrees from the phase of the intermodulation distortions occurring in the amplifier.

FIG. 19 is a configuration diagram showing a distortion compensation circuit disclosed in Patent Literature 1 mentioned later. FIG. 20 is a configuration diagram showing a distortion generator circuit in the distortion compensation circuit of FIG. 19.

In the distortion compensation circuit, a distortion generator circuit 103 that generates intermodulation distortions having opposite characteristics to intermodulation distortions occurring in an amplifier is inserted between an input terminal 101 and an output terminal 102.

This distortion compensation circuit includes an impedance conversion circuit 104 that changes the impedance for a frequency band corresponding to a difference frequency $(f_2-f_1)$ of two-wave RF signals (i.e., an RF signal with a frequency $f_1$ and an RF signal with a frequency $f_2$), which are input through the input terminal 101.

Since the impedance conversion circuit 104 is provided, the amplitude and phase characteristics of the intermodulation distortions generated by the distortion generator circuit 103 can be adjusted without affecting the characteristics of frequency bands used by the two-wave RF signals.

Therefore, by adjusting the amplitude and phase characteristics of the intermodulation distortions generated by the distortion generator circuit 103 as appropriate in dependence on the intermodulation distortions occurring in the amplifier, the intermodulation distortions occurring in the amplifier can be accurately compensated for.

The impedance conversion circuit 104 is composed of an inductor 105, a resistor 106, and a capacitor 107.

The inductor 105 and the capacitor 107 have individual unique self-resonant frequencies, and do not function as an inductor and a capacitor unless the frequencies $f_1$ and $f_2$ of RF signals are equal to or lower than the self-resonant frequencies. In general, the self-resonant frequencies tend to decrease as the values of the inductor and capacitor increase due to the influence of parasitic capacitance, etc.

The frequency band corresponding to the difference frequency $(f_2-f_1)$ of two-wave RF signals (an RF signal with the frequency $f_1$ and an RF signal with the frequency $f_2$) input through the input terminal 101 is several hundred MHz or less.

Hence, to change impedance in that frequency band, there is a need to use the inductor 105 and the capacitor 107 that have large values. However, since the frequencies $f_1$ and $f_2$ of the two-wave RF signals are normally several GHz or more, the frequencies $f_1$ and $f_2$ are expected to exceed the unique self-resonant frequencies of the inductor 105 and the capacitor 107.

CITATION LIST

Patent Literature 1: JP 2004-15390 A (paragraph [0015])

SUMMARY OF INVENTION

Since the conventional distortion compensation circuit is configured in the above-described manner, impedance can be changed in the frequency band corresponding to the difference frequency $(f_2-f_1)$ of two-wave RF signals (an RF signal with the frequency $f_1$ and an RF signal with the frequency $f_2$) by using the inductor 105 and the capacitor 107 that have large values. However, when the frequencies $f_1$ and $f_2$ of the two-wave RF signals are several GHz or more, the inductor 105 and the capacitor 107 do not function as an ideal inductor and capacitor because the frequencies $f_1$ and $f_2$ exceed the self-resonant frequencies of the inductor 105 and the capacitor 107. As a result, there is a problem that the RF impedances in the frequency bands used by the two-wave RF signals may not reach an opened condition, affecting RF characteristics.

Assuming that there are an inductor and a capacitor that have ideal characteristics for a wide band, the RF impedances in the frequency bands used by the two-wave RF signals could reach an opened condition by using such the inductor and the capacitor. However, they are expensive, causing cost increase.

The present invention is made to solve problems like those described above. An object of the invention is to obtain a distortion compensation circuit which is capable of accurately compensating for intermodulation distortions occurring in an amplifier without affecting RF characteristics, even if the inexpensive inductor and capacitor having low self-resonant frequencies are used.

A distortion compensation circuit on a basis of the invention is configured to include: a linearizer circuit to generate, in response to an input of a plurality of radio frequency signals through an input terminal, a difference-frequency signal and intermodulation distortions of the radio frequency signals; a low-pass circuit to block passage of the radio frequency signals and the intermodulation distortions generated by the linearizer circuit and to allow passage of the difference-frequency signal, one end of the low-pass circuit being connected to the signal path; and an intermodulation distortion adjustment circuit to adjust intermodulation distortions appearing in the signal path by reflecting the difference-frequency signal having passed through the low-pass circuit to return to the linearizer circuit, the intermodulation distortion adjustment circuit being connected between another end of the low-pass circuit and a ground, wherein the linearizer circuit includes a diode and a resistor, the diode being connected between the signal path and a ground, the resistor being connected between a DC terminal and the signal path, the low-pass circuit includes a transmission line whose one end is connected to the signal path and another end is connected to the intermodulation distortion adjustment circuit, and an open stub whose one end is connected to the transmission line, each of the transmission line and the open stub having a length of a quarter wavelength at a center frequency of the radio frequency signals, and the intermodulation distortion adjustment circuit includes a reactance element.

According to the present invention, the low-pass circuit, which acts to block the passage of a plurality of radio frequency signals and intermodulation distortions generated by the linearizer circuit and to allow the passage of a difference-frequency signal, is connected between the signal path and the intermodulation distortion adjustment circuit. Therefore, even if the intermodulation distortion adjustment circuit is composed by using the inexpensive inductor and capacitor having low self-resonant frequencies, intermodulation distortions appearing in the signal path can be adjusted without affecting RF characteristics. As a result, there is an effect of being able to accurately compensate for intermodulation distortions occurring in an amplifier without affecting RF characteristics.

DESCRIPTION OF EMBODIMENTS

In order to explain the invention in more detail, embodiments for carrying out the invention will be described below with reference to the accompanying drawings.

Embodiment 1

Figure 1:
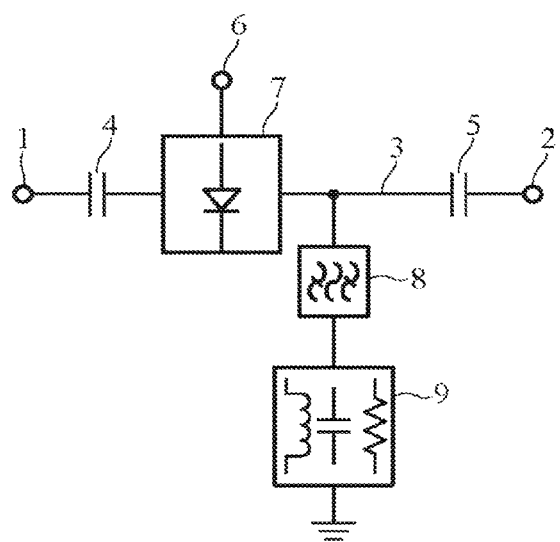
FIG. 1 is a configuration diagram showing a distortion compensation circuit of Embodiment 1 of the invention.

FIG. 1 is a configuration diagram showing a distortion compensation circuit of Embodiment 1 of the invention.

The distortion compensation circuit of FIG. 1 is connected with an amplifier (not shown) at a stage previous to an input terminal 1 or a stage subsequent to an output terminal 2.

In FIG. 1, the input terminal 1 is a terminal that accepts as input two-wave RF signals (radio frequency signals). In the Embodiment 1, the input terminal 1 is assumed to accept as input an RF signal with a frequency $f_1$ and an RF signal with a frequency $f_2$, where $f_1 < f_2$.

Although the Embodiment 1 describes, for simplification of description, an example in which two-wave RF signals are input, three or more wave RF signals may be input alternatively.

The output terminal 2 is a terminal that outputs two-wave RF signals, and intermodulation distortions having opposite characteristics to intermodulation distortions occurring in the amplifier.

DC-cut capacitors 4 and 5 are inserted, for example, in a signal path 3 so that a signal of a difference frequency $(f_2 - f_1)$ of the two-wave RF signals $(f_1, f_2)$ (hereinafter, referred to as "difference-frequency signal") generated by a linearizer circuit 7 is not output externally.

A DC terminal 6 is a terminal to which a direct-current voltage is employed.

The linearizer circuit 7 is a circuit that is inserted in the signal path 3 and that generates a difference-frequency signal $(f_2 - f_1)$ and intermodulation distortions $(2f_2 - f_1, 2f_1 - f_2)$ in response to the input of the two-wave RF signals $(f_1, f_2)$.

A low-pass circuit 8 is a filter that is connected at one end thereof to the signal path 3. The low-pass circuit 8 has a characteristic that allows the passage of only signals having lower frequencies than the two-wave RF signals $(f_1, f_2)$ and the intermodulation distortions $(2f_2 - f_1, 2f_1 - f_2)$ generated by the linearizer circuit 7. Hence, the low-pass circuit 8 acts to block the passage of the two-wave RF signals $(f_1, f_2)$ and the intermodulation distortions $(2f_2 - f_1, 2f_1 - f_2)$ and to allow the passage of the difference-frequency signal $(f_2 - f_1)$.

An intermodulation distortion adjustment circuit 9 is a circuit that is connected between another end of the low-pass circuit 8 and a ground. The intermodulation distortion adjustment circuit 9 adjusts intermodulation distortions $(2f_2 - f_1, 2f_1 - f_2)$ appearing in the signal path 3 by reflecting the difference-frequency signal $(f_2 - f_1)$ having passed through the low-pass circuit 8 to return to the linearizer circuit 7.

Next, operation will be described.

Two-wave RF signals $(f_1, f_2)$ input through the input terminal 1 are input to the linearizer circuit 7.

The linearizer circuit 7 has nonlinear characteristics. Therefore, in response to the input of the two-wave RF signals ($f_1$, $f_2$), a difference-frequency signal ($f_2-f_1$), intermodulation distortions ($2f_2-f_1$, $2f_1-f_2$), second harmonics ($2f_1$, $2f_2$), etc., are generated, and after that, the two-wave RF signals ($f_1$, $f_2$), the difference-frequency signal ($f_2-f_1$), the intermodulation distortions ($2f_2-f_1$, $2f_1-f_2$), the second harmonics ($2f_1$, $2f_2$), etc., appear on the output side of the linearizer circuit 7.

Here, the low-pass circuit 8 is loaded between the signal path 3 and the intermodulation distortion adjustment circuit 9. Thus, impedance looking from the signal path 3 into the intermodulation distortion adjustment circuit 9 indicates an opened state for the two-wave RF signals ($f_1$, $f_2$) and the intermodulation distortions ($2f_2-f_1$, $2f_1-f_2$). As a result, those two-wave RF signals ($f_1$, $f_2$) and the intermodulation distortions ($2f_2-f_1$, $2f_1-_2$), and also the second harmonics ($2f_1$, $2f_2$) do not leak out toward the intermodulation distortion adjustment circuit 9.

In contrast to above, the difference-frequency signal ($f_2-f_1$) passes through the low-pass circuit 8 and reaches the intermodulation distortion adjustment circuit 9.

The difference-frequency signal ($f_2-f_1$), which has passed through the low-pass circuit 8 and has reached the intermodulation distortion adjustment circuit 9, is reflected by the intermodulation distortion adjustment circuit 9, and passes through the low-pass circuit 8 again, and returns to the linearizer circuit 7.

Since the difference-frequency signal ($f_2-f_1$) returns to the linearizer circuit 7, mixed waves of the two-wave RF signals ($f_1$, $f_2$) and the difference-frequency signal ($f_2-f_1$) appear at frequencies $2f_2-f_1$ and $2f_1-f_2$ due to a mixing effect of the linearizer circuit 7.

Subsequently, in the signal path 3, vector composition occurs on mixed-wave components appearing at the frequencies $2f_2-f_1$ and $2f_1-f_2$ and the intermodulation distortions ($2f_2-f_1$, $2f_1-f_2$) generated by the linearizer circuit 7, and the composite components produced by the vector composition are output from the output terminal 2.

Adjustment of the composite components produced by the vector composition in the signal path 3 enables the intermodulation distortion adjustment circuit 9 to adjust the impedance of the difference-frequency signal ($f_2-f_1$). Therefore, when the amplifier is connected to a stage subsequent to the output terminal 2, the impedance of the difference-frequency signal ($f_2-f_1$) is adjusted such that the composite components appearing in the signal path 3 have opposite characteristics to intermodulation distortions occurring in the amplifier of the subsequent stage.

On the other hand, when the amplifier is connected to a stage previous to the input terminal 1, the impedance of the difference-frequency signal ($f_2-f_1$) is adjusted such that intermodulation distortions, which are generated by the amplifier of the previous stage and are input through the input terminal 1, are canceled out by the composite components appearing in the signal path 3.

The intermodulation distortion adjustment circuit 9 is composed of, for example, an inductance, a capacitor, etc., and adjusts the impedance of the difference-frequency signal ($f_2-f_1$) by adjusting the inductance, capacitor, etc. Since the low-pass circuit 8 connected to a stage previous to the intermodulation distortion adjustment circuit 9 normally blocks the passage of RF signals ($f_1$, $f_2$) with frequencies of several GHz or more, even if the intermodulation distortion adjustment circuit 9 is composed by using an inexpensive inductor and capacitor having low self-resonant frequencies, the characteristics of the intermodulation distortion adjustment circuit 9 do not affect RF characteristics.

Note that upon adjustment of the impedance of the difference-frequency signal ($f_1-f_1$) by the intermodulation distortion adjustment circuit 9, it is only necessary to consider the low-frequency characteristics of components such as an inductor and a capacitor. Therefore, flexibility in the selection of components and flexibility in adjustment improve. As a result, a reduction in adjustment cost and component cost can be achieved.

As is clear from the above, according to the Embodiment 1, the low-pass circuit 8 is configured to block the passage of two-wave RF signals ($f_1$, $f_2$) and intermodulation distortions ($2f_2-f_1$, $2f_1-f_2$) generated by the linearizer circuit 7 and to allow the passage of a difference-frequency signal ($f_2-f_1$) be connected between the signal path 3 and the intermodulation distortion adjustment circuit 9. Therefore, even if the intermodulation distortion adjustment circuit 9 is composed by using an inexpensive inductor and capacitor having low self-resonant frequencies, intermodulation distortions ($2f_2-f_1$, $2f_1-f_2$) appearing in the signal path 3 can be adjusted without affecting RF characteristics. As a result, there is provided an effect of being able to accurately compensate for intermodulation distortions occurring in the amplifier without affecting RF characteristics.

The Embodiment 1 discloses that intermodulation distortions ($2f_2-f_1$, $2f_1-f_2$) appearing in the signal path 3 are adjusted by adjusting the inductance, capacitor, etc., provided in the intermodulation distortion adjustment circuit 9. Alternatively, the intermodulation distortions ($2f_2-f_1$, $2f_1-f_2$) appearing in the signal path 3 can be adjusted by adjusting the impedances for RF frequencies viewed from the linearizer circuit 7 by using a voltage applied to the DC terminal 6.

In addition, the Embodiment 1 discloses an example in which the low-pass circuit 8 and the intermodulation distortion adjustment circuit 9 are connected to a stage subsequent to the linearizer circuit 7. Alternatively, the low-pass circuit 8 and the intermodulation distortion adjustment circuit 9 may be connected to a stage previous to the linearizer circuit 7 so far as they are provided between the DC-cut capacitor 4 and the DC-cut capacitor 5.

Embodiment 2

Figure 2:
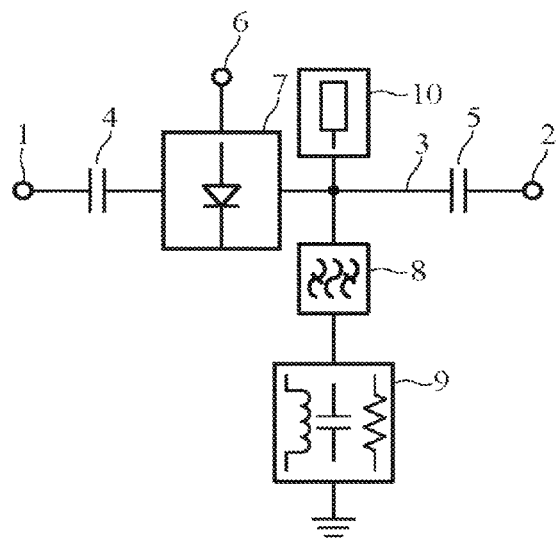
FIG. 2 is a configuration diagram showing a distortion compensation circuit of Embodiment 2 of the invention.

FIG. 2 is a configuration diagram showing a distortion compensation circuit of Embodiment 2 of the invention. In FIG. 2, the same reference signs as those in FIG. 1 indicate the same or corresponding portions and thus description thereof is omitted.

A harmonic impedance adjustment circuit 10 is a circuit that is connected at one end thereof to a signal path 3. The harmonic impedance adjustment circuit 10 adjusts intermodulation distortions ($2f_2-f_1$, $2f_1-f_2$) appearing in the signal path 3 by reflecting second harmonics ($2f_1$, $2f_2$), which are harmonic components of two-wave RF signals ($f_1$, $f_2$) generated by a linearizer circuit 7, to return to the linearizer circuit 7.

The harmonic impedance adjustment circuit 10 adjusts the impedances of the second harmonics ($2f_1$, $2f_2$) such that the intermodulation distortions ($2f_2-f_1$, $2f_1$, $-f_2$) appearing in the signal path 3 have opposite characteristics to intermodulation distortions occurring in the amplifier.

Although the Embodiment 2 describes an example in which the harmonic impedance adjustment circuit 10 adjusts the impedances of the second harmonics ($2f_1$, $2f_2$), this is simply one example. Alternatively, for further example, intermodulation distortions associated with the third harmonics and appearing in the signal path 3 may be adjusted by adjusting impedances of third harmonics ($3f_1$, $3f_2$).

Next, operation will be described.

The distortion compensation circuit of FIG. 2 is configured such that the harmonic impedance adjustment circuit 10 is added to the distortion compensation circuit of FIG. 1.

The linearizer circuit 7 has nonlinear characteristics. Therefore, in response to the input of two-wave RF signals ($f_1$, $f_2$), a difference-frequency signal ($f_2-f_1$), intermodulation distortions ($2f_2-f_1$, $2f_1-f_2$), second harmonics ($2f_1$, $2f_2$), etc., are generated, and after that, the two-wave RF signals ($f_1$, $f_1$), the difference-frequency signal ($f_2-f_1$), the intermodulation distortions ($2f_2-f_1$, $2f_1-f_2$), the second harmonics ($2f_1$, $2f_2$), etc., appear on the output side of the linearizer circuit 7.

In the above-described Embodiment 1, intermodulation distortions ($2f_2-f_1$, $2f_1-f_2$) generated by the amplifier are compensated for by the intermodulation distortion adjustment circuit 9 adjusting the impedance of a difference-frequency signal ($f_2-f_1$) such that composite components produced by the vector composition in the signal path 3 have opposite characteristics to the intermodulation distortions $2f_1-f_2$) generated by the amplifier. In contrast, in the Embodiment 2, also the impedances of second harmonics ($2f_1$, $2f_2$) are adjusted by the harmonic impedance adjustment circuit 10 to enhance the compensation accuracy of the intermodulation distortions ($2f_2-f_1$, $2f_1-f_2$) generated by the amplifier.

In other words, the harmonic impedance adjustment circuit 10 acts to reflect second harmonics ($2f_1$, $2f_2$) generated by the linearizer circuit 7 to return to the linearizer circuit 7.

Since the second harmonics ($2f_1$, $2f_2$) return to the linearizer circuit 7, mixed waves of the two-wave RF signals ($f_1$, $f_2$) and the second harmonics ($2f_1$, $2f_2$) appear at frequencies $2f_2-f_1$ and $2f_1-f_2$ by a mixing effect of the linearizer circuit 7.

Subsequently, in the signal path 3, vector composition occurs on mixed-wave components appearing at the frequencies $2f_2-f_1$ and $2f_1-f_2$ and the intermodulation distortions ($2f_2-f_1$, $2f_1-f_2$) generated by the linearizer circuit 7, and the composite components produced by the vector composition are output from the output terminal 2.

Adjustment of the composite components produced by the vector composition in the signal path 3 enables the intermodulation distortion adjustment circuit 9 to adjust the impedance of the difference-frequency signal ($f_2-f_1$) and also enables the harmonic impedance adjustment circuit 10 to adjust the impedances of the second harmonics ($2f_1$, $2f_2$). Therefore, when the amplifier is connected to a stage subsequent to the output terminal 2, the impedance of the difference-frequency signal ($f_2-f_1$) and the impedances of the second harmonics ($2f_1$, $2f_2$) are adjusted such that the composite components output through the output terminal 2 have opposite characteristics to intermodulation distortions occurring in the amplifier of the subsequent stage.

On the other hand, when the amplifier is connected to a stage previous to the input terminal 1, the impedance of the difference-frequency signal ($f_2-f_1$) and the impedances of the second harmonics ($2f_1$, $2f_2$) are adjusted such that intermodulation distortions, which are generated by the amplifier of the previous stage and are input through the input terminal 1, are canceled out by the composite components produced by the vector composition.

Accordingly, since the harmonic impedance adjustment circuit 10 is provided, the compensation accuracy of intermodulation distortions occurring in the amplifier can be more enhanced over a case where impedance is adjusted only by the intermodulation distortion adjustment circuit 9.

Embodiment 3

Figure 3:
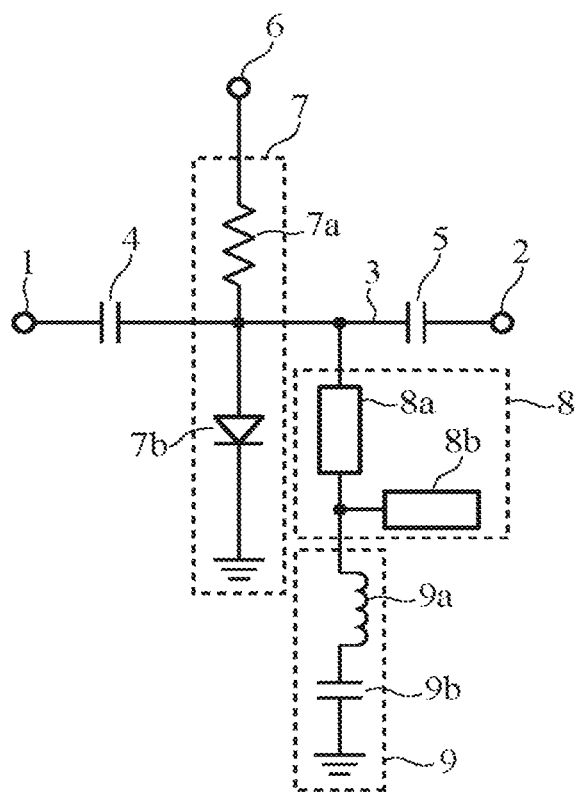
FIG. 3 is a configuration diagram showing a distortion compensation circuit of Embodiment 3 of the invention.

FIG. 3 is a configuration diagram showing a distortion compensation circuit of Embodiment 3 of the invention. In FIG. 3, the same reference signs as those in FIG. 1 indicate the same or corresponding portions and thus description thereof is omitted.

A linearizer circuit 7 is composed of a resistor 7a and a diode 7b. While the resistor 7a is connected between a DC terminal 6 and a signal path 3, the diode 7b is connected between the signal path 3 and a ground.

A low-pass circuit 8 is composed of a transmission line 8a and an open stub 8b. The transmission line 8a is connected at one end thereof to the signal path 3 and is connected at another end to an intermodulation distortion adjustment circuit 9. The open stub 8b is connected at one end thereof to another end of the transmission line 8a.

The intermodulation distortion adjustment circuit 9 is composed of a low-frequency inductor 9a and a low-frequency capacitor 9b. The low-frequency inductor 9a is connected at one end thereof to the low-pass circuit 8. The low-frequency capacitor 9b is connected at one end thereof to another end of the low-frequency inductor 9a and is connected at another end to a ground.

The basic operation of the distortion compensation circuit of FIG. 3 is equivalent to that of a distortion compensation circuit of FIG. 1 in the above-described Embodiment 1. However, since the low-pass circuit 8 is composed of the transmission line 8a and the open stub 8b, a shift from an opened condition at a desired frequency due to variations in the characteristics of components can be suppressed compared to a case where the low-pass circuit 8 is composed by using chip components.

Note that the lengths of the transmission line 8a and the open stub 8b are design parameters and may be selected, for example, such that the transmission line 8a and the open stub 8b are a quarter wavelength long at a center frequency.

Embodiment 4

Figure 4:
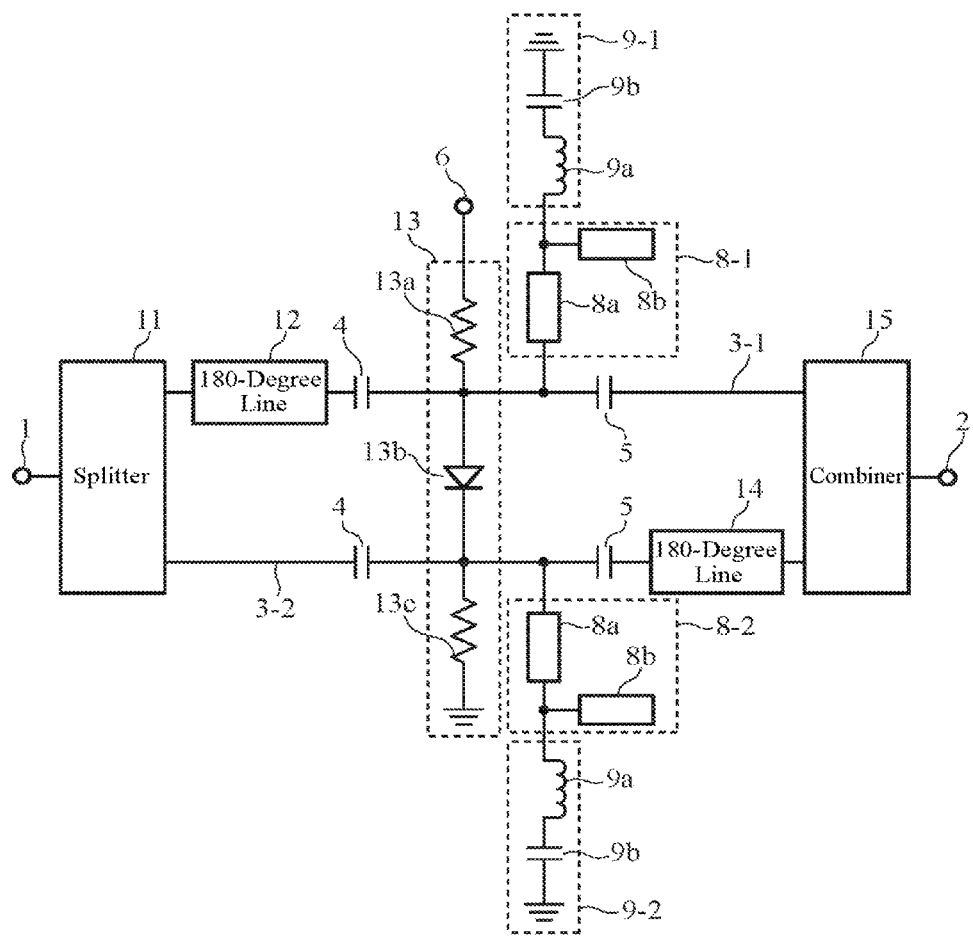
FIG. 4 is a configuration diagram showing a distortion compensation circuit of Embodiment 4 of the invention.

FIG. 4 is a configuration diagram showing a distortion compensation circuit of Embodiment 4 of the invention. In FIG. 4, the same reference signs as those in FIG. 3 indicate the same or corresponding portions and thus description thereof is omitted.

A signal path 3-1 as a first signal path and a signal path 3-2 as a second signal path compose differential signal paths.

A splitter 11 splits two-wave RF signals ($f_1$, $f_2$), which are input through an input terminal 1, into two signals. The splitter 11 outputs one RF signal ($f_1$, $f_2$) to the signal path 3-1 and outputs the other RF signal ($f_1$, $f_2$) to the signal path 3-2.

A 180-degree line 12 is inserted in the signal path 3-1, and is configured to shift the phase of the RF signal ($f_1$, $f_2$) split by the splitter 11 by 180 degrees.

The splitter 11 and the 180-degree line 12 compose a differential signal converter that converts each of the two-wave RF signals ($f_1$, $f_2$) input through the input terminal 1 into differential signals.

The RF signal ($f_1$, $f_2$) having been shifted in phase by 180 degrees by the 180-degree line 12 and the RF signal ($f_1$, $f_2$) output from the splitter 11 to the signal path 3-2 compose a pair of differential signals.

The 180-degree phase shifted RF signal ($f_1$, $f_2$) is hereinafter referred to as the first RF signals (the first radio frequency signal), and the RF signal ($f_1$, $f_2$) output from the splitter 11 to the signal path 3-2 is hereinafter referred to as the second RF signals (the second radio frequency signal).

A linearizer circuit 13 is a circuit that is inserted in the signal paths 3-1 and 3-2. The linearizer circuit 13 generates a difference-frequency signal ($f_2-f_1$), intermodulation distortions ($2f_2-f_1$, $2f_1$, $f_2$), etc., in response to the input of the first RF signals ($f_1$, $f_2$) and the second RF signals ($f_1$, $f_2$). The first RF signals ($f_1$, $f_2$), the difference-frequency signal ($f_2-f_1$), the intermodulation distortions ($2f_2-f_1$, $2f_1-f_2$), second harmonics ($2f_1$, $2f_2$), etc., appear in the signal path 3-1. The second RF signals ($f_1$, $f_2$), the difference-frequency signal ($f_2-f_1$), the intermodulation distortions ($2f_2-f_1$, $2f_1-f_2$), the second harmonics ($2f_1$, $2f_2$), etc., appear in the signal path 3-2.

In addition, the linearizer circuit 13 is composed of a resistor 13a, a diode 13b, and a resistor 13c. The resistor 13a is connected between a DC terminal 6 and the signal path 3-1. The diode 13b is connected between the signal path 3-1 and the signal path 3-2. The resistor 13c is connected between the signal path 3-2 and a ground.

A low-pass circuit 8-1 as a first low-pass circuit is a filter that is connected at one end thereof to the signal path 3-1. The low-pass circuit has a characteristic that allows only the passage of signals having lower frequencies than the first RF signals ($f_1$, $f_2$) and the intermodulation distortions ($2f_2-f_1$, $2f_1-f_2$) generated in the signal path 3-1. Hence, the low-pass circuit 8-1 acts to block the passage of the first RF signals ($f_1$, $f_2$) and the intermodulation distortions ($2f_2-f_1$, $2f_1-f_2$) generated in the signal path 3-1 and to allow the passage of the difference-frequency signal ($f_2-f_1$).

A low-pass circuit 8-2 as a second low-pass circuit is a filter that is connected at one end thereof to the signal path 3-2. The low-pass circuit 8-2 has a characteristic that allows only the passage of signals having lower frequencies than the second RF signals ($f_1$, $f_2$) and the intermodulation distortions ($2f_2-f_1$, $2f_1-f_2$) generated in the signal path 3-2. Hence, the low-pass circuit 8-2 acts to block the passage of the second RF signals ($f_1$, $f_2$) and the intermodulation distortions ($2f_2-f_1$, $2f_1-f_2$) generated in the signal path 3-2 and to allow the passage of the difference-frequency signal ($f_2-f_1$).

An intermodulation distortion adjustment circuit 9-1 as a first intermodulation distortion adjustment circuit is a circuit that is connected between another end of the low-pass circuit 8-1 and a ground. The intermodulation distortion adjustment circuit 9-1 adjusts the intermodulation distortions ($2f_2-f_1$, $2f_1-f_2$) appearing in the signal path 3-1 by reflecting the difference-frequency signal ($f_2-f_1$) having passed through the low-pass circuit 8-1 to return to the linearizer circuit 13.

An intermodulation distortion adjustment circuit 9-2 as a second intermodulation distortion adjustment circuit is a circuit that is connected between another end of the low-pass circuit 8-2 and a ground. The intermodulation distortion adjustment circuit 9-2 adjusts the intermodulation distortions ($2f_2-f_1$, $2f_1-f_2$) appearing in the signal path 3-2 by reflecting the difference-frequency signal ($f_2-f_1$) having passed through the low-pass circuit 8-2 to return to the linearizer circuit 13.

A 180-degree line 14 is inserted in the signal path 3-2, and shifts the phases of signals having been transmitted through the signal path 3-2 by 180 degrees.

A combiner 15 combines signals having been transmitted through the signal path 3-1 with signals having been transmitted through the signal path 3-2 to convert the differential signals into single-phase signals.

Note that the 180-degree line 14 and the combiner 15 compose a single-phase signal converter.

Next, operation will be described.

The basic operation of the distortion compensation circuit of FIG. 4 is equivalent to that of a distortion compensation circuit of FIG. 1 in the above-described Embodiment 1. However, the distortion compensation circuit of FIG. 4 differs from that of FIG. 1 in that, two-wave RF signals ($f_1$, $f_2$) input through the input terminal 1 are converted into differential signals.

The details are described as follows.

When two-wave RF signals ($f_1$, $f_2$) are input from the input terminal 1 to the splitter 11, the splitter 11 splits the two-wave RF signals ($f_1$, $f_2$), and outputs one RF signal ($f_1$, $f_2$) to the signal path 3-1 and outputs the other RF signal ($f_1$, $f_2$) to the signal path 3-2.

On receiving the RF signal ($f_1$, $f_2$) from the splitter 11, the 180-degree line 12 shifts the phase of the RF signal ($f_1$, $f_2$) by 180 degrees and outputs the 180-degree phase shifted RF signal ($f_1$, $f_2$).

As described above, the 180-degree phase shifted RF signal ($f_1$, $f_2$) and the RF signal ($f_1$, $f_2$) output from the splitter 11 to the signal path 3-2 compose a pair of differential signals.

The linearizer circuit 13 has nonlinear characteristics. Therefore, in response to the input of the first RF signals ($f_1$, $f_2$) being the 180-degree phase shifted RF signal ($f_1$, $f_2$) and the second RF signals ($f_1$, $f_2$) being the RF signal ($f_1$, $f_2$) output from the splitter 11 to the signal path 3-2, difference-frequency signal ($f_2-f_1$), intermodulation distortions ($2f_2-f_1$, $2f_1-f_2$), second harmonics ($2f_1$, $2f_2$), etc., are generated. After that, the first RF signals ($f_1$, $f_2$), the difference-frequency signal ($f_2-f_1$), the intermodulation distortions ($2f_2-f_1$, $2f_1-f_2$), the second harmonics ($2f_1$, $2f_2$), etc., appear in the signal path 3-1, and the second RF signals ($f_1$, $f_2$), the difference-frequency signal ($f_2-f_1$), the intermodulation distortions ($2f_2-f_1$, $2f_1-f_2$), the second harmonics ($2f_1$, $2f_2$), etc., appear in the signal path 3-2.

Here, the low-pass circuit 8-1 is loaded between the signal path 3-1 and the intermodulation distortion adjustment circuit 9-1. Thus, impedance looking from the signal path 3-1 into the intermodulation distortion adjustment circuit 9-1 indicates an opened state for the first RF signals ($f_1$, $f_2$) and the intermodulation distortions ($2f_2-f_1$, $2f_1-f_2$). As a result, those first RF signals ($f_1$, $f_2$), the intermodulation distortions ($2f_2-f_1$, $2f_1-f_2$), and also the second harmonics ($2f_1$, $2f_2$) do not leak out toward the intermodulation distortion adjustment circuit 9-1 side.

In contrast to above, the difference-frequency signal ($f_2-f_1$) passes through the low-pass circuit 8-1 and reaches the intermodulation distortion adjustment circuit 9-1.

The difference-frequency signal ($f_2-f_1$), which has passed through the low-pass circuit 8-1 and has reached the intermodulation distortion adjustment circuit 9-1, is reflected by the intermodulation distortion adjustment circuit 9-1, passes through the low-pass circuit 8-1 again, and returns to the linearizer circuit 13.

Since the difference-frequency signal ($f_2-f_1$) returns to the linearizer circuit 13, mixed waves of the first RF signals ($f_1$, $f_2$) and the difference-frequency signal ($f_2-f_1$) appear at frequencies $2f_2-f_1$ and $2f_1-f_2$ due to a mixing effect of the linearizer circuit 13.

Subsequently, in the signal path 3-1, vector composition occurs on mixed-wave components appearing at the frequencies $2f_2-f_1$ and $2f_1-f_2$ and the intermodulation distortions ($2f_2-f_1$, $2f_1-f_2$) generated by the linearizer circuit 13, and the composite components produced by the vector composition are output to the combiner 15.

Adjustment of the composite components produced by the vector composition in the signal path 3-1 is capable of adjusting the impedance of the difference-frequency signal ($f_2-f_1$). Thus, as with an intermodulation distortion adjustment circuit 9 of FIG. 1 in the above-described Embodiment 1, the intermodulation distortion adjustment circuit 9-1 adjusts the impedance of the difference-frequency signal ($f_2-f_1$)

As with the intermodulation distortion adjustment circuit 9 of FIG. 1, the intermodulation distortion adjustment circuit 9-1 is composed of, for example, an inductance, a capacitor, etc., and adjusts the impedance of the difference-frequency signal ($f_2-f_1$) by adjusting the inductance, capacitor, etc. Since the low-pass circuit 8-1 connected to a stage previous to the intermodulation distortion adjustment circuit 9-1 normally blocks the passage of RF signals ($f_1$, $f_2$) with frequencies of several GHz or more, even if the intermodulation distortion adjustment circuit 9-1 is composed using an inexpensive inductor and capacitor having low self-resonant frequencies, the characteristics of the intermodulation distortion adjustment circuit 9-1 do not affect RF characteristics.

In addition, the low-pass circuit 8-2 is loaded between the signal path 3-2 and the intermodulation distortion adjustment circuit 9-2. Thus, impedance looking from the signal path 3-2 into the intermodulation distortion adjustment circuit 9-2 indicates an opened state for the second RF signals ($f_1$, $f_2$) and the intermodulation distortions ($2f_2-f_1$, $2f_1-f_2$). As a result, those second RF signals ($f_1$, $f_2$) and the intermodulation distortions ($2f_2-f_1$, $2f_1-f_2$), and also the second harmonics ($2f_1$, $2f_2$) do not leak out to the intermodulation distortion adjustment circuit 9-2.

In contrast to above, the difference-frequency signal ($f_2-f_1$) passes through the low-pass circuit 8-2 and reaches the intermodulation distortion adjustment circuit 9-2.

The difference-frequency signal ($f_2-f_1$), which has passed through the low-pass circuit 8-2 and has reached the intermodulation distortion adjustment circuit 9-2, is reflected by the intermodulation distortion adjustment circuit 9-2, passes through the low-pass circuit 8-2 again, and returns to the linearizer circuit 13.

Since the difference-frequency signal ($f_2-f_1$) returns to the linearizer circuit 13, mixed waves of the second RF signals ($f_1$, $f_2$) and the difference-frequency signal ($f_2-f_1$) appear at frequencies $2f_2-f_1$ and $2f_1-f_2$ due to the mixing effect of the linearizer circuit 13.

Subsequently, in the signal path 3-2, vector composition occurs on mixed-wave components appearing at the frequencies $2f_2-f_1$ and $2f_1-f_2$ and the intermodulation distortions ($2f_2-f_1$, $2f_1-f_2$) generated by the linearizer circuit 13, and the composite components produced by the vector composition are output to the 180-degree line 14.

Adjustment of the composite components produced by the vector composition in the signal path 3-2 is capable of adjusting the impedance of the difference-frequency signal ($f_2-f_1$). Thus, as with the intermodulation distortion adjustment circuit 9 of FIG. 1 in the above-described Embodiment 1, the intermodulation distortion adjustment circuit 9-2 adjusts the impedance of the difference-frequency signal ($f_2-f_1$).

As with the intermodulation distortion adjustment circuit 9 of FIG. 1, the intermodulation distortion adjustment circuit 9-2 is composed of, for example, an inductance, a capacitor, etc., and adjusts the impedance of the difference-frequency signal ($f_2-f_1$) by adjusting the inductance, capacitor, etc. Since the low-pass circuit 8-2 connected to a stage previous to the intermodulation distortion adjustment circuit 9-2 normally blocks the passage of RF signals ($f_1$, $f_2$) with frequencies of several GHz or more, even if the intermodulation distortion adjustment circuit 9-2 is composed using an inexpensive inductor and capacitor having low self-resonant frequencies, the characteristics of the intermodulation distortion adjustment circuit 9-2 do not affect RF characteristics.

Among the second RF signals ($f_1$, $f_2$), the difference-frequency signal ($f_2-f_1$), the second harmonics ($2f_1$, $2f_2$), and the composite components ($2f_2-f_1$, $2f_1-f_2$) each of which appears in the signal path 3-2, the 180-degree line 14 shifts, in phase by 180 degrees, signals having passed through a DC-cut capacitor 5. Here, the difference-frequency signal ($f_2-f_1$) cannot pass through the DC-cut capacitor 5.

Among the first RF signals ($f_1$, $f_2$), the difference-frequency signal ($f_2-f_1$), the second harmonics ($2f_1$, $2f_2$), and the composite components ($2f_2-f_1$, $2f_1-f_2$) each of which appears in the signal path 3-1, the combiner 15 combines together signals having passed through a DC-cut capacitor 5 (here, the difference-frequency signal ($f_2-f_1$) cannot pass through the DC-cut capacitor 5) and the signal shifted in phase by 180 degrees by the 180-degree line 14 to convert the differential signals into single-phase signals. The single-phase signals are output through the output terminal 2.

In the above-described Embodiments 1-3, as shown in FIG. 3, a diode 7b in a linearizer circuit 7 is connected to a ground. To create the ground in an actual circuit, a through-hole needs to be made upon mounting the diode 7b, and the parasitic inductor of the through-hole may cause a problem.

In contrast, according to the Embodiment 4, two-wave RF signals ($f_1$, $f_2$) input through the input terminal 1 are converted into differential signals. Therefore, a virtual GND can be formed at the center of the diode 13b in the linearizer circuit 13. Accordingly, there is no need to make a through-hole upon mounting the diode 13b, enabling to avoid the influence of the parasitic inductor of the through-hole.

Therefore, in the Embodiment 4, the same effects as those obtained in the Embodiments 1-3 are obtained, and in addition, the distortion compensation circuit of the Embodiment 4 is less susceptible to a parasitic component compared to distortion compensation circuits of the Embodiments 1-3, and thus obtains an effect of being able to allow the linearizer circuit 13 to operate even at higher frequencies.

The Embodiment 4 discloses an example in which the low-pass circuits 8-1 and 8-2 and the intermodulation distortion adjustment circuits 9-1 and 9-2 are connected to a stage subsequent to the linearizer circuit 13. Alternatively, the low-pass circuits 8-1 and 8-2 and the intermodulation distortion adjustment circuits 9-1 and 9-2 may be connected to a stage previous to the linearizer circuit 13 so far as they are provided between DC-cut capacitors 4 and the DC-cut capacitors 5.

In addition, the positions of the DC-cut capacitor 4 and the 180-degree line 12 may be switched. Likewise, the positions of the DC-cut capacitor 5 and the 180-degree line 14 may be switched.

Embodiment 5

Figure 5:
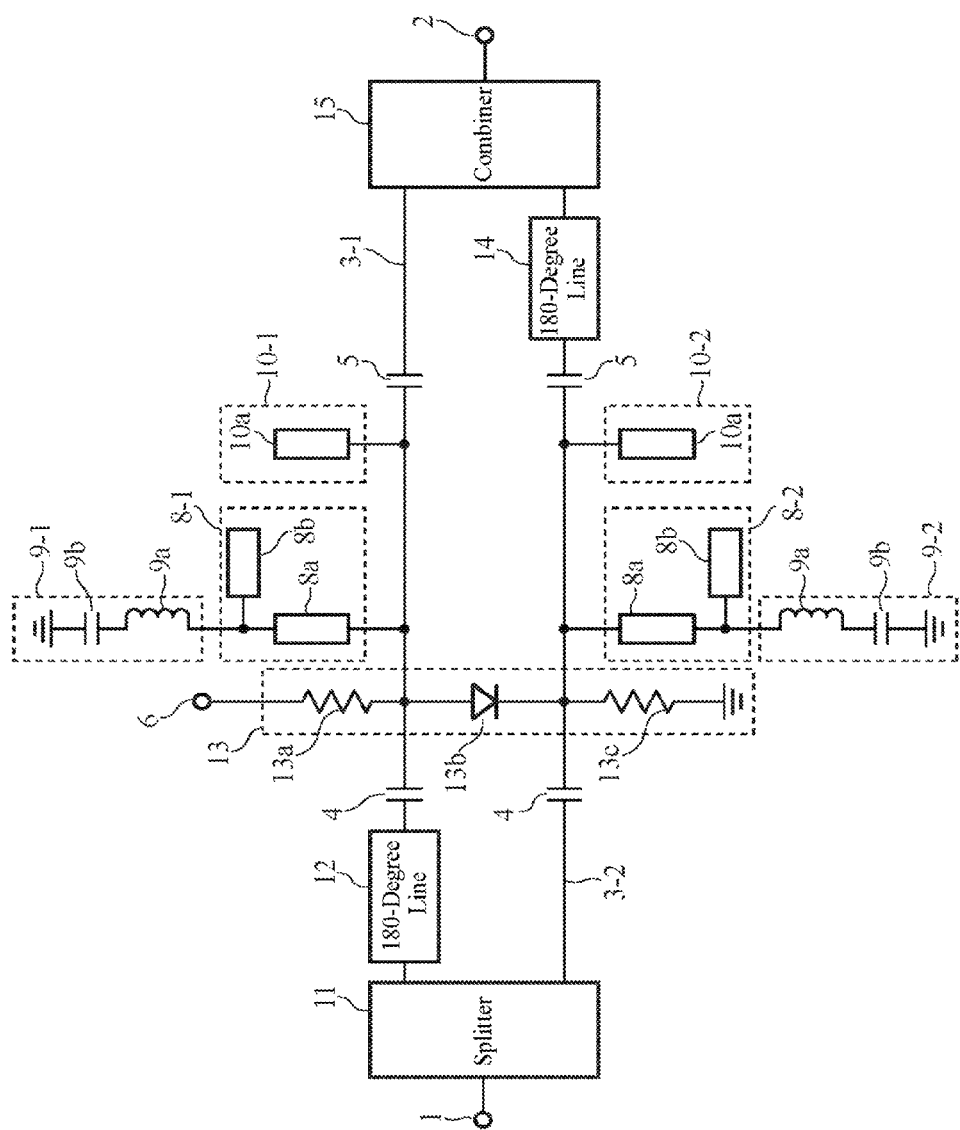
FIG. 5 is a configuration diagram showing a distortion compensation circuit of Embodiment 5 of the invention.

FIG. 5 is a configuration diagram showing a distortion compensation circuit of Embodiment 5 of the invention. In FIG. 5, the same reference signs as those in FIG. 4 indicate the same or corresponding portions and thus description thereof is omitted.

A harmonic impedance adjustment circuit 10-1 as a first harmonic impedance adjustment circuit is a circuit that is composed of a harmonic open stub 10a connected at one end thereof to a signal path 3-1. The harmonic impedance adjustment circuit 10-1 adjusts intermodulation distortions $(2f_2-f_1, 2f_1-f_2)$ appearing in the signal path 3-1 by reflecting second harmonics $(2f_1, 2f_2)$ of first RF signals $(f_1, f_2)$ generated by a linearizer circuit 13 to return to the linearizer circuit 13.

In addition, the harmonic impedance adjustment circuit 10-1 adjusts the impedance of the second harmonics $(2f_1, 2f_2)$ such that the intermodulation distortions $(2f_2-f_1, 2f_1-f_2)$ appearing in the signal path 3-1 have opposite characteristics to intermodulation distortions occurring in the amplifier.

A harmonic impedance adjustment circuit 10-2 as a second harmonic impedance adjustment circuit is a circuit that is composed of a harmonic open stub 10a connected at one end thereof to a signal path 3-2. The harmonic impedance adjustment circuit 10-2 adjusts intermodulation distortions $(2f_2-f_1, 2f_1-f_2)$ appearing in the signal path 3-2, by reflecting second harmonics $(2f_1, 2f_2)$ of a second RF signals $(f_1, f_2)$ generated by the linearizer circuit 13 to return to the linearizer circuit 13.

In addition, the harmonic impedance adjustment circuit 10-2 adjusts the impedance of the second harmonics $(2f_1, 2f_2)$ such that the intermodulation distortions $(2f_2-f_1, 2f_1-f_2)$ appearing in the signal path 3-2 have opposite characteristics to the intermodulation distortions occurring in the amplifier.

Although the Embodiment 5 describes an example in which the harmonic impedance adjustment circuits 10-1 and 10-2 adjust the impedances of the second harmonics $(2f_1, 2f_2)$, this is simply one example. Alternatively, for further example, intermodulation distortions associated with the third harmonics appearing in the signal paths 3-1 and 3-2 may be adjusted by adjusting the impedances of third harmonics $(3f_1, 3f_2)$.

Next, operation will be described.

The distortion compensation circuit of FIG. 5 is such that the harmonic impedance adjustment circuits 10-1 and 10-2 are added to a distortion compensation circuit of FIG. 4.

The linearizer circuit 13 has nonlinear characteristics. Therefore, in response to the input of the first RF signals $(f_1, f_2)$ and the second RF signals $(f_1, f_2)$, a difference-frequency signal $(f_2-f_1)$, intermodulation distortions $(2f_2-f_1, 2f_1-f_2)$, the second harmonics $(2f_1, 2f_2)$, etc., are generated, and after that, the two-wave RF signals $(f_1, f_2)$, the difference-frequency signal $(f_2-f_1)$, the intermodulation distortions $(2f_2-f_1, 2f_1-f_2)$, the second harmonics $(2f_1, 2f_2)$, etc., appear on the output side of the linearizer circuit 13.

In the above-described Embodiment 4, intermodulation distortion adjustment circuits 9-1 and 9-2 compensate for intermodulation distortions $(2f_2-f_1, 2f_1-f_2)$ generated by an amplifier by adjusting the impedance of a difference-frequency signal $(f_2-f_1)$ such that composite components produced by the vector composition in signal paths 3-1 and 3-2 have opposite characteristics to the intermodulation distortions $(2f_2-f_1, 2f_1-f_2)$ generated by the amplifier. In contrast, in the Embodiment 5, also the impedances of the second harmonics $(2f_1, 2f_2)$ are adjusted by the harmonic impedance adjustment circuits 10-1 and 10-2 to enhance the compensation accuracy of the intermodulation distortions $(2f_2-f_1, 2f_1-f_2)$ generated by the amplifier.

In other words, the harmonic impedance adjustment circuit 10-1 acts to reflect second harmonics $(2f_1, 2f_2)$ generated by the linearizer circuit 13 to return to the linearizer circuit 13.

Since the second harmonics $(2f_1, 2f_2)$ return to the linearizer circuit 13, mixed waves of the two-wave RF signals $(f_1, f_2)$ and the second harmonics $(2f_1, 2f_2)$ appear at frequencies $2f_2-f_1$ and $2f-f_2$ by a mixing effect of the linearizer circuit 13.

Subsequently, in the signal path 3-1, vector composition occurs on mixed-wave components appearing at the frequencies $2f_2-f_1$ and $2f_1-f_2$ and the intermodulation distortions $(2f_2-f_1 2f_1-f_2)$ generated by the linearizer circuit 13, and the composite components produced by the vector composition are output to a combiner 15.

In addition, the harmonic impedance adjustment circuit 10-2 acts to reflect second harmonics $(2f_1, 2f_2)$ generated by the linearizer circuit 13 to return to the linearizer circuit 13.

Since the second harmonics $(2f_1, 2f_2)$ return to the linearizer circuit 13, mixed waves of the two-wave RF signals $(f_1, f_2)$ and the second harmonics $(2f_1, 2f_2)$ appear at frequencies $2f_2-f_1$ and $2f_1-f_2$ by the mixing effect of the linearizer circuit 13.

Subsequently, in the signal path 3-2, vector composition occurs on mixed-wave components appearing at the frequencies $2f_2-f_1$ and $2f_1-f_2$ and the intermodulation distortions $(2f_2-f_1, 2f_1, f_2)$ generated by the linearizer circuit 13, and the composite components produced by the vector composition are output to a 180-degree line 14.

Adjustment of the composite components produced by the vector composition in the signal paths 3-1 and 3-2 enables the intermodulation distortion adjustment circuits 9-1 and 9-2 to adjust the impedance of the difference-frequency signal $(f_2-f_1)$ and by the harmonic impedance adjustment circuits 10-1 and 10-2 adjusting the impedances of the second harmonics $(2f_1, 2f_2)$. Therefore, when the amplifier is connected to a stage subsequent to an output terminal 2, the impedance of the difference-frequency signal $(f_2-f_1)$ and the impedances of the second harmonics $(2f_1, 2f_2)$ are adjusted such that the composite components in the signal paths 3-1 and 3-2 have opposite characteristics to intermodulation distortions occurring in the amplifier of the subsequent stage.

On the other hand, when the amplifier is connected to a stage previous to an input terminal 1, the impedance of the difference-frequency signal $(f_2-f_1)$ and the impedances of the second harmonics $(2f_1, 2f_2)$ are adjusted such that intermodulation distortions, which are input through the input terminal 1 and generated by the amplifier, are canceled out by the composite components produced by the vector composition.

Accordingly, since the harmonic impedance adjustment circuits 10-1 and 10-2 are provided, the compensation accuracy of intermodulation distortions occurring in the amplifier can be more enhanced over a case in which impedance is adjusted only by the intermodulation distortion adjustment circuits 9-1 and 9-2.

Embodiment 6

Figure 6:
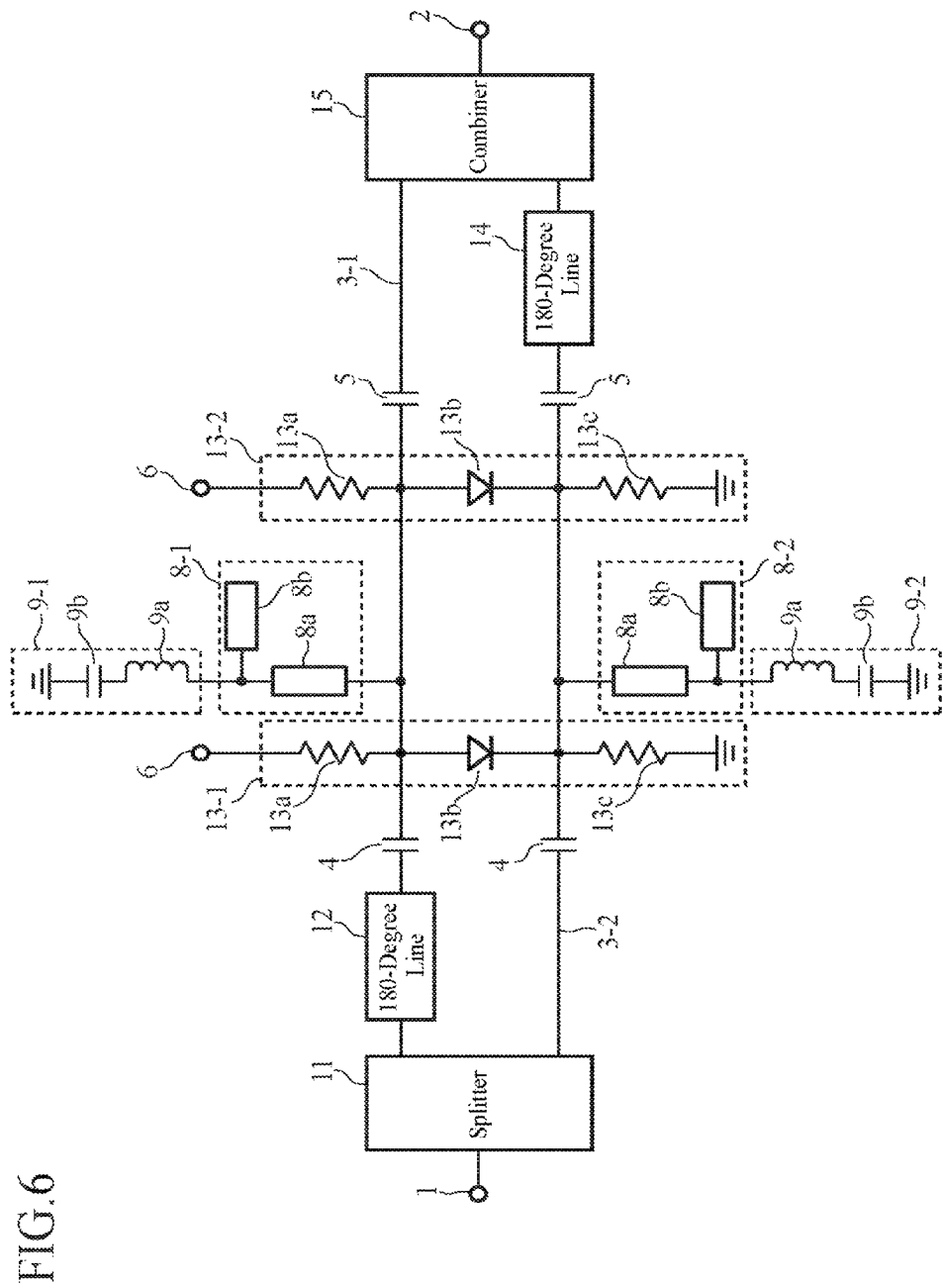
FIG. 6 is a configuration diagram showing a distortion compensation circuit of Embodiment 6 of the invention.

FIG. 6 is a configuration diagram showing a distortion compensation circuit of Embodiment 6 of the invention. In FIG. 6, the same reference signs as those in FIG. 4 indicate the same or corresponding portions and thus description thereof is omitted.

Linearizer circuits 13-1 and 13-2 are respectively the same as a linearizer circuit 13 of FIG. 4. The Linearizer circuits 13-1 and 13-2 are circuits that generate a difference-frequency signal ($f_2-f_1$), intermodulation distortions ($2f_2-f_1$, $2f_1-f_2$), etc., in response to the input of a first RF signals ($f_1$, $f_2$) and a second RF signals ($f_1$, $f_2$)

The distortion compensation circuit of the Embodiment 6 differs from a distortion compensation circuit of FIG. 4 in the above-described Embodiment 4 in that, the linearizer circuits 13-1 and 13-2 are connected in a manner of multistage, but basic operation is equivalent to the Embodiment 4.

Since the linearizer circuits 13-1 and 13-2 are connected in a manner of multistage, intermodulation distortions ($2f_2-f_1$, $2f_1-f_2$) having opposite characteristics to intermodulation distortions occurring in an amplifier can be produced with high accuracy. Furthermore, the compensation accuracy of the intermodulation distortions occurring in the amplifier can be enhanced.

In FIG. 6, although the linearizer circuits 13-1 and 13-2 have a two-stage configuration, a three-stage or more configurations are available.

In addition, not only the linearizer circuits 13-1 and 13-2, but also low-pass circuits 8-1 and 8-2 and intermodulation distortion adjustment circuits 9-1 and 9-2 may be connected in a manner of multistage.

Embodiment 7

Figure 7:
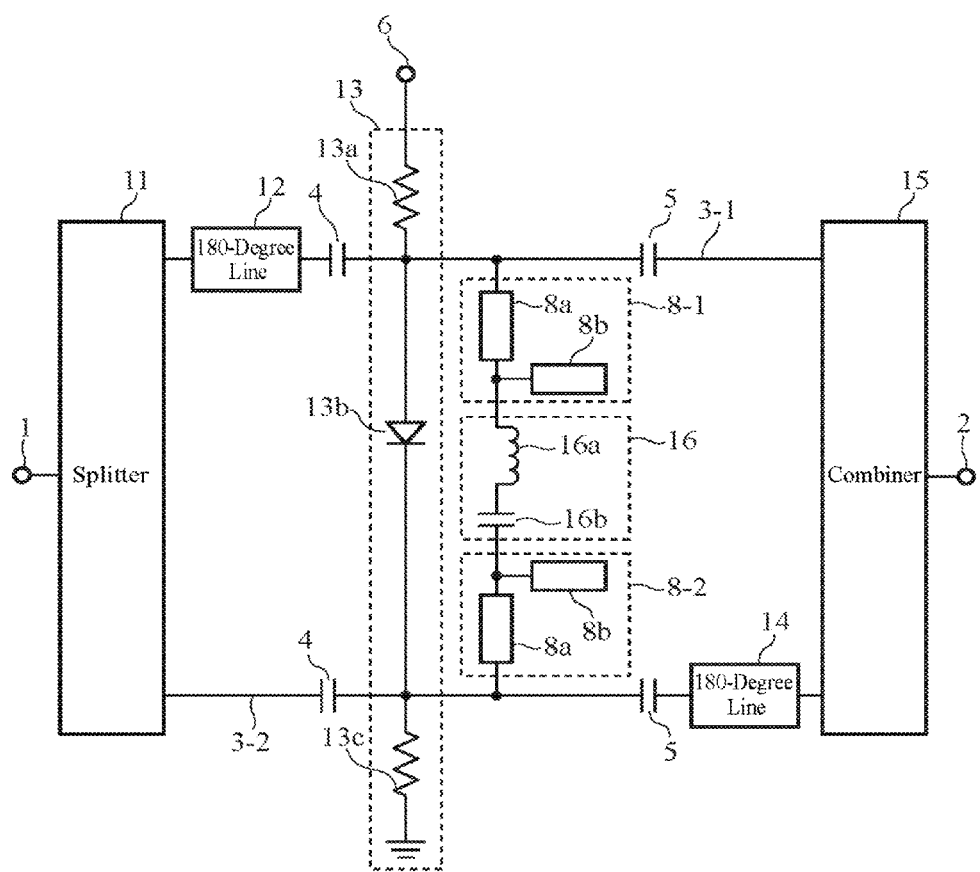
FIG. 7 is a configuration diagram showing a distortion compensation circuit of Embodiment 7 of the invention.

FIG. 7 is a configuration diagram showing a distortion compensation circuit of Embodiment 7 of the invention. In FIG. 7, the same reference signs as those in FIG. 4 indicate the same or corresponding portions and thus description thereof is omitted.

An intermodulation distortion adjustment circuit 16 is a circuit that is connected between a low-pass circuit 8-1 and a low-pass circuit 8-2. The intermodulation distortion adjustment circuit 16 adjusts intermodulation distortions ($2f_2-f_1$, $2f_1-f_2$) appearing in signal paths 3-1 and 3-2 by reflecting a difference-frequency signal ($f_2-f_1$) having passed through the low-pass circuit 8-1 to return to a linearizer circuit 13 and reflecting a difference-frequency signal ($f_2-f_1$) having passed through the low-pass circuit 8-2 to return to the linearizer circuit 13.

The intermodulation distortion adjustment circuit 16 is composed of an inductor 16a and a capacitor 16b.

Next, operation will be described.

The basic operation of the distortion compensation circuit of FIG. 7 is equivalent to that of a distortion compensation circuit of FIG. 4 in the above-described Embodiment 4.

Note that, in the distortion compensation circuit of FIG. 7, since the intermodulation distortion adjustment circuit 16 is connected between the low-pass circuit 8-1 and the low-pass circuit 8-2, a virtual GND is formed in the intermodulation distortion adjustment circuit 16.

Therefore, upon mounting the intermodulation distortion adjustment circuit 16, there is no need to make through-holes for connecting intermodulation distortion adjustment circuits 9-1 and 9-2 to grounds, like the distortion compensation circuit of FIG. 4, enabling to avoid the influence of the parasitic inductors of the through-holes.

According to the Embodiment 7, the distortion compensation circuit is less susceptible to parasitic components compared to the distortion compensation circuit of the Embodiment 4, and thus, the linearizer circuit 13 can be allowed to operate even at higher frequencies.

Embodiment 8

Figure 8:
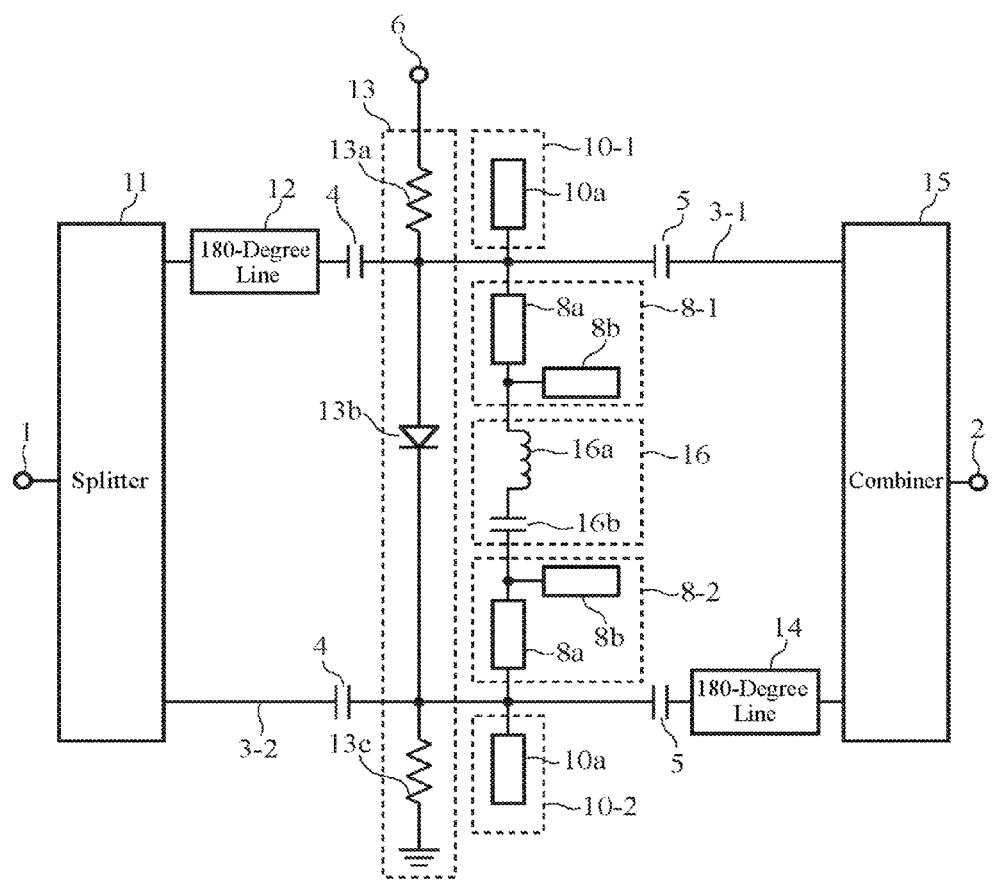
FIG. 8 is a configuration diagram showing a distortion compensation circuit of Embodiment 8 of the invention.

FIG. 8 is a configuration diagram showing a distortion compensation circuit of Embodiment 8 of the invention. In FIG. 8, the same reference signs as those in FIGS. 5 and 7 indicate the same or corresponding portions and thus description thereof is omitted.

Next, operation will be described.

The distortion compensation circuit of FIG. 8 is configured such that harmonic impedance adjustment circuits 10-1 and 10-2 are added to a distortion compensation circuit of FIG. 7.

The linearizer circuit 13 has nonlinear characteristics. Therefore, in response to the input of first RF signals ($f_1$, $f_2$) as 180-degree phase shifted RF signals ($f_1$, $f_2$) and second RF signals ($f_1$, $f_2$) as RF signals ($f_1$, $f_2$) output to the signal path 3-2 from the splitter 11, a difference-frequency signal ($f_2-f_1$), intermodulation distortions ($2f_2-f_1$, $2f_1-f_2$), second harmonics ($2f_1$, $2f_2$), etc., are generated. After that, the first RF signals ($f_1$, $f_2$), the difference-frequency signal ($f_2-f_1$), the intermodulation distortions ($2f_2-f_1$, $2f_1-f_2$), second harmonics ($2f_1$, $2f_2$), etc., appear in a signal path 3-1, and the second RF signals ($f_1$, $f_2$), the difference-frequency signal ($f_2-f_1$), the intermodulation distortions ($2f_2-f_1$, $2f_1-f_2$), second harmonics ($2f_1$, $2f_2$), etc., appear in the signal path 3-2.

The harmonic impedance adjustment circuit 10-1 acts to reflect second harmonics ($2f_1$, $2f_2$) generated by the linearizer circuit 13 to return to the linearizer circuit 13.

Since the second harmonics ($2f_1$, $2f_2$) return to the linearizer circuit 13, mixed waves of the two-wave RF signals ($f_1$, $f_2$) and the second harmonics ($2f_1$, $2f_2$) appear at frequencies $2f_2-f_1$ and $2f_1-f_2$ by a mixing effect of the linearizer circuit 13.

Subsequently, in the signal path 3-1, vector composition occurs on mixed-wave components appearing at the frequencies $2f_2-f_1$ and $2f_1-f_2$ and the intermodulation distortions ($2f_2-f_1$, $2f_1-f_2$) generated by the linearizer circuit 13, and the composite components produced by the vector composition are output to a combiner 15.

Similarly, the harmonic impedance adjustment circuit 10-2 acts to reflect second harmonics ($2f_1$, $2f_2$) generated by the linearizer circuit 13 to return to the linearizer circuit 13.

Since the second harmonics ($2f_1$, $2f_2$) return to the linearizer circuit 13, mixed waves of the two-wave RF signals ($f_1$, $f_2$) and the second harmonics ($2f_1$, $2f_2$) appear at frequencies $2f_2-f_1$ and $2f_1-f_2$ by the mixing effect of the linearizer circuit 13.

Subsequently, in the signal path 3-2, vector composition occurs on mixed-wave components appearing at the frequencies $2f_2-f_1$ and $2f_1-f_2$ and the intermodulation distortions ($2f_2-f_1$, $2f_1-f_2$) generated by the linearizer circuit 13, and the composite components produced by the vector composition are output to a 180-degree line 14.

Adjustment of the composite components produced by the vector composition in the signal paths 3-1 and 3-2 enables the intermodulation distortion adjustment circuit 16 to adjust the impedance of the difference-frequency signal ($f_2-f_1$) and also enables the harmonic impedance adjustment circuits 10-1 and 10-2 to adjust the impedances of the second harmonics ($2f_1$, $2f_2$). Therefore, when an amplifier is connected to a stage subsequent to an output terminal 2, the impedance of the difference-frequency signal ($f_2-f_1$) and the impedances of the second harmonics ($2f_1$, $2f_2$) are adjusted such that the composite components produced by the vector composition in the signal paths 3-1 and 3-2 have opposite characteristics to intermodulation distortions occurring in the amplifier.

On the other hand, when the amplifier is connected to a stage previous to the input terminal 1, the impedance of the difference-frequency signal ($f_2-f_1$) and the impedances of the second harmonics ($2f_1$, $2f_2$) are adjusted such that intermodulation distortions, which are input through the input terminal 1 and are generated by the amplifier, are canceled out by the composite components produced by the vector composition.

Thus, since the harmonic impedance adjustment circuits 10-1 and 10-2 are provided, the compensation accuracy of intermodulation distortions occurring in the amplifier can be more enhanced over a case in which impedance is adjusted only by the intermodulation distortion adjustment circuit 16.

Embodiment 9

Figure 9:
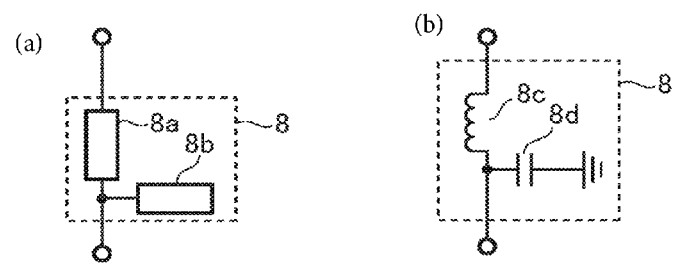
FIGS. 9A to 9B are configuration diagrams each of which shows an example of a low-pass circuit.

The above-described Embodiments 3-8 show a low-pass circuit 8 composed of a transmission line 8a and an open stub 8b (see FIG. 9A). Alternatively, as shown in FIG. 9B, a low-pass circuit 8 may be composed of a high-frequency inductor 8c and a high-frequency capacitor 8d.

In this case, there is a need to use the high-frequency inductor 8c and the high-frequency capacitor 8d whose self-resonant frequencies are higher than the frequencies of RF signals ($f_1$, $f_2$).

In addition, when composing the low-pass circuits 8, the circuit of FIG. 9A and the circuit of FIG. 9B can be configured in a manner of multistage.

Embodiment 10

Figure 10:
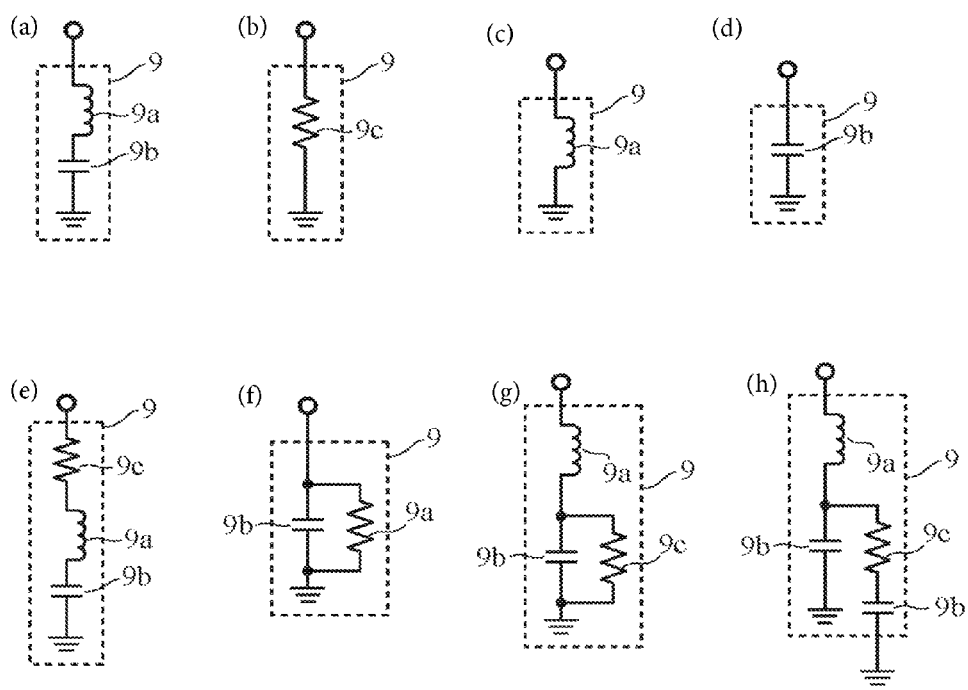
FIGS. 10A to 10H are configuration diagrams each of which shows an example of an intermodulation distortion adjustment circuit.

The above-described Embodiments 3-8 show intermodulation distortion adjustment circuits 9 and 16 composed of a low-frequency inductor 9a and a low-frequency capacitor 9b (see FIG. 10A). Alternatively, the intermodulation distortion adjustment circuits 9 and 16 may be any circuit so long as the circuit can change impedance at low frequencies (a circuit capable of adjusting intermodulation distortions ($2f_2-f_1$, $2f_1-f_2$) appearing in a signal path 3). For example, the intermodulation distortion adjustment circuits 9 and 16 may be circuits such as those shown in FIGS. 10B-10H.

In FIGS. 10A-10H, a reference sign 9c indicates a low-frequency resistor.

Embodiment 11

Figure 11:
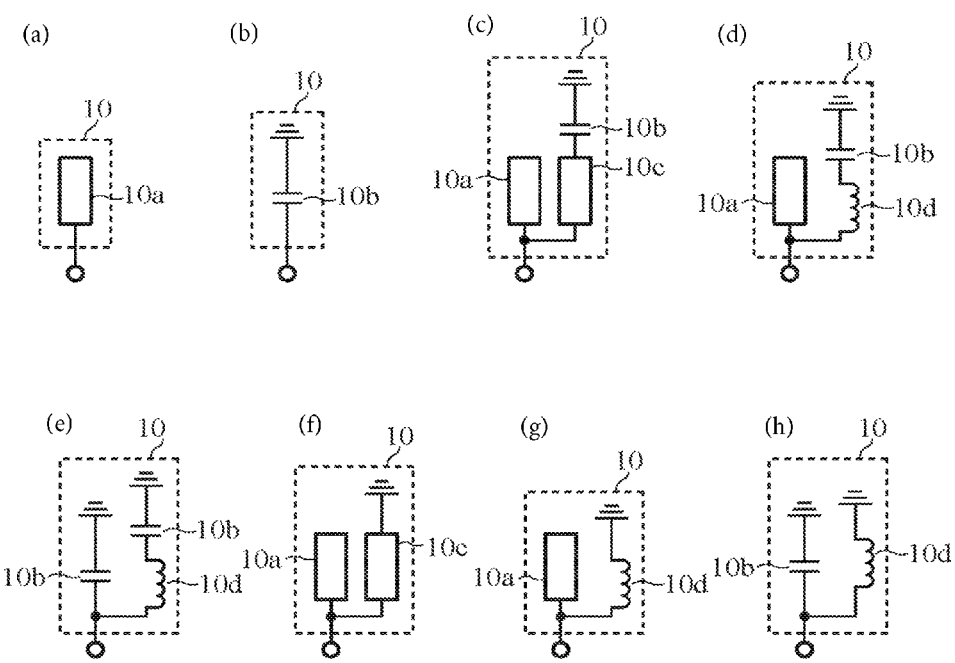
FIGS. 11A to 11H are configuration diagrams each of which shows an example of a harmonic impedance adjustment circuit.

The above-described Embodiments 5 and 8 show a harmonic impedance adjustment circuit 10 composed of a harmonic open stub 10a (see FIG. 11A). Alternatively, the harmonic impedance adjustment circuit 10 may be any circuit capable of adjusting impedance by using a double or triple wave of the frequencies of RF signals ($f_1$, $f_2$).

FIGS. 11A-11H are configuration diagrams each of which shows an example of the harmonic impedance adjustment circuit 10. For example, in harmonic impedance adjustment circuits 10 shown in FIGS. 11A-11B, each element value is determined to short-circuit at a twice wave.

Generally, when harmonic impedance is adjusted, fundamental impedance also changes. In contrast, in harmonic impedance adjustment circuits 10 of FIGS. 11C-11H, a transmission line 10c or a harmonic inductance 10d is loaded to cancel out a reactance component of a fundamental. Therefore, the harmonic impedance can be adjusted without changing the fundamental impedance. Note that a reference sign 10b indicates a DC-cut high-frequency capacitor.

Embodiment 12

The above-described Embodiments 1-11 show intermodulation distortion adjustment circuits 9, 9-1, 9-2, and 16 composed of reactance elements with fixed reactance (e.g., a low-frequency inductor 9a, a low-frequency capacitor 9b, etc.). Alternatively, the intermodulation distortion adjustment circuits 9, 9-1, 9-2, and 16 may be composed of reactance elements with variable reactance.

Figure 12:
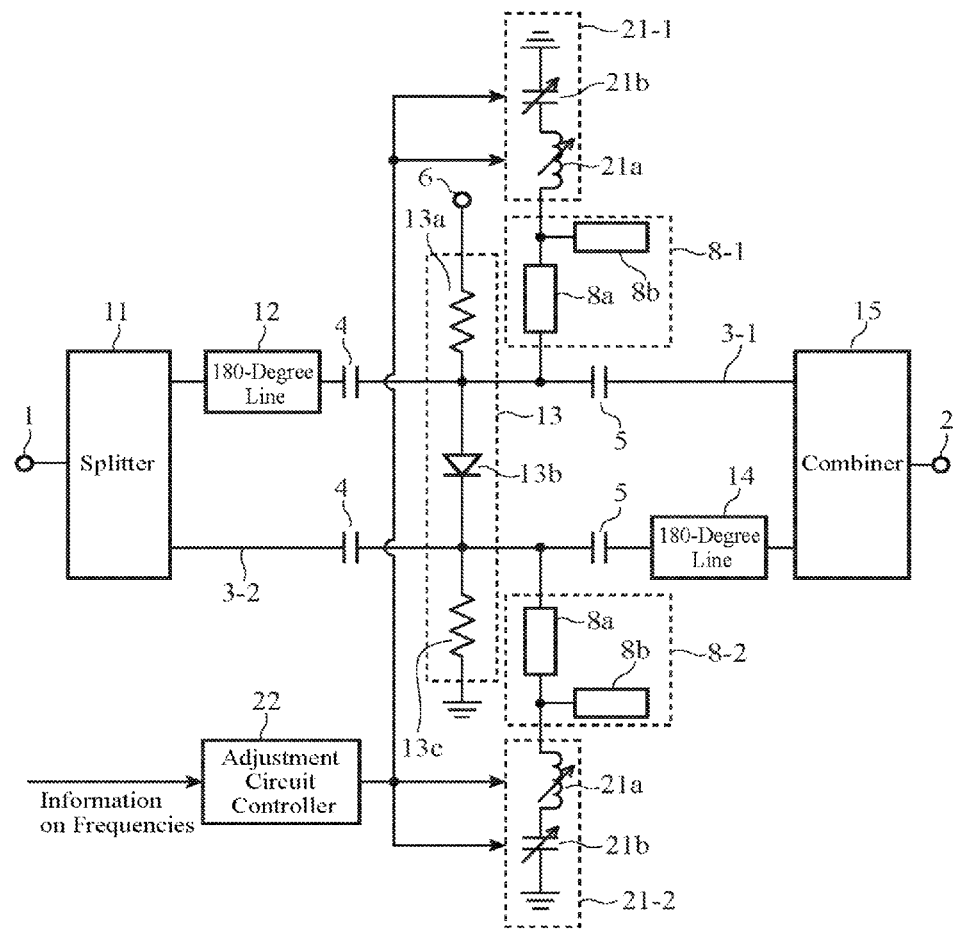
FIG. 12 is a configuration diagram showing a distortion compensation circuit of Embodiment 12 of the invention.

FIG. 12 is a configuration diagram showing a distortion compensation circuit of Embodiment 12 of the invention. In FIG. 12, the same reference signs as those in FIGS. 4 to 6 indicate the same or corresponding portions and thus description thereof is omitted.

An intermodulation distortion adjustment circuit 21-1 is a circuit corresponding to an intermodulation distortion adjustment circuit 9-1. Note that, unlike the intermodulation distortion adjustment circuit 9-1, the intermodulation distortion adjustment circuit 21-1 is composed of reactance elements with variable reactance (i.e., a variable inductor 21a and a variable capacitor 21b).

An intermodulation distortion adjustment circuit 21-2 is a circuit corresponding to an intermodulation distortion adjustment circuit 9-2. Note that, unlike the intermodulation distortion adjustment circuit 9-2, the intermodulation distortion adjustment circuit 21-2 is composed of reactance elements with variable reactance (i.e., a variable inductor 21a and a variable capacitor 21b).

An adjustment circuit controller 22 is composed of, for example, a microcomputer, etc. The adjustment circuit controller 22 controls the reactance of the variable inductors 21a and the variable capacitors 21b in the intermodulation distortion adjustment circuits 21-1 and 21-2 on a basis of information on frequencies (e.g., operating frequencies, signal band, or detuning frequency) of two-wave RF signals (an RF signal with a frequency $f_1$ and an RF signal with a frequency $f_2$) which are input through the input terminal 1.

In the Embodiment 12, an example is shown, in which the intermodulation distortion adjustment circuits 9-1 and 9-2 of FIGS. 4 to 6 are replaced with the intermodulation distortion adjustment circuits 21-1 and 21-2, and also the adjustment circuit controller 22 is employed. Alternatively, the intermodulation distortion adjustment circuits 9 may be replaced with the intermodulation distortion adjustment circuit 21-1 of FIGS. 1 to 3 along with employing the adjustment circuit controller 22.

In addition, the intermodulation distortion adjustment circuits 16 of FIG. 7 may be replaced with the intermodulation distortion adjustment circuit 21-1 along with employing the adjustment circuit controller 22.

Next, operation will be described.

The basic operation of the distortion compensation circuit of FIG. 12 is equivalent to that of a distortion compensation circuit of FIG. 4 in the above-described Embodiment 4.

Differences from the distortion compensation circuit of FIG. 4 will be described below.

The adjustment circuit controller 22 accepts, as input, information on the frequencies (e.g., operating frequencies, signal band, or detuning frequency) of two-wave RF signals (an RF signal with the frequency $f_1$ and an RF signal with the frequency $f_2$) which are input through the input terminal 1.

The information on the frequencies of two-wave RF signals can be acquired from, for example, a signal generator apparatus such as a modem handling the two-wave RF signals.

After accepting, as input, information indicating the detuning frequency ($f_2-f_1$) of the two-wave RF signals as the information on the frequencies of two-wave RF signals, the adjustment circuit controller 22 controls the reactance of the variable inductors 21a and the variable capacitors 21b such that, the inductances of the intermodulation distortion adjustment circuits 21-1 and 21-2 become smaller as the detuning frequency ($f_2-f_1$) is wider.

Figure 13:
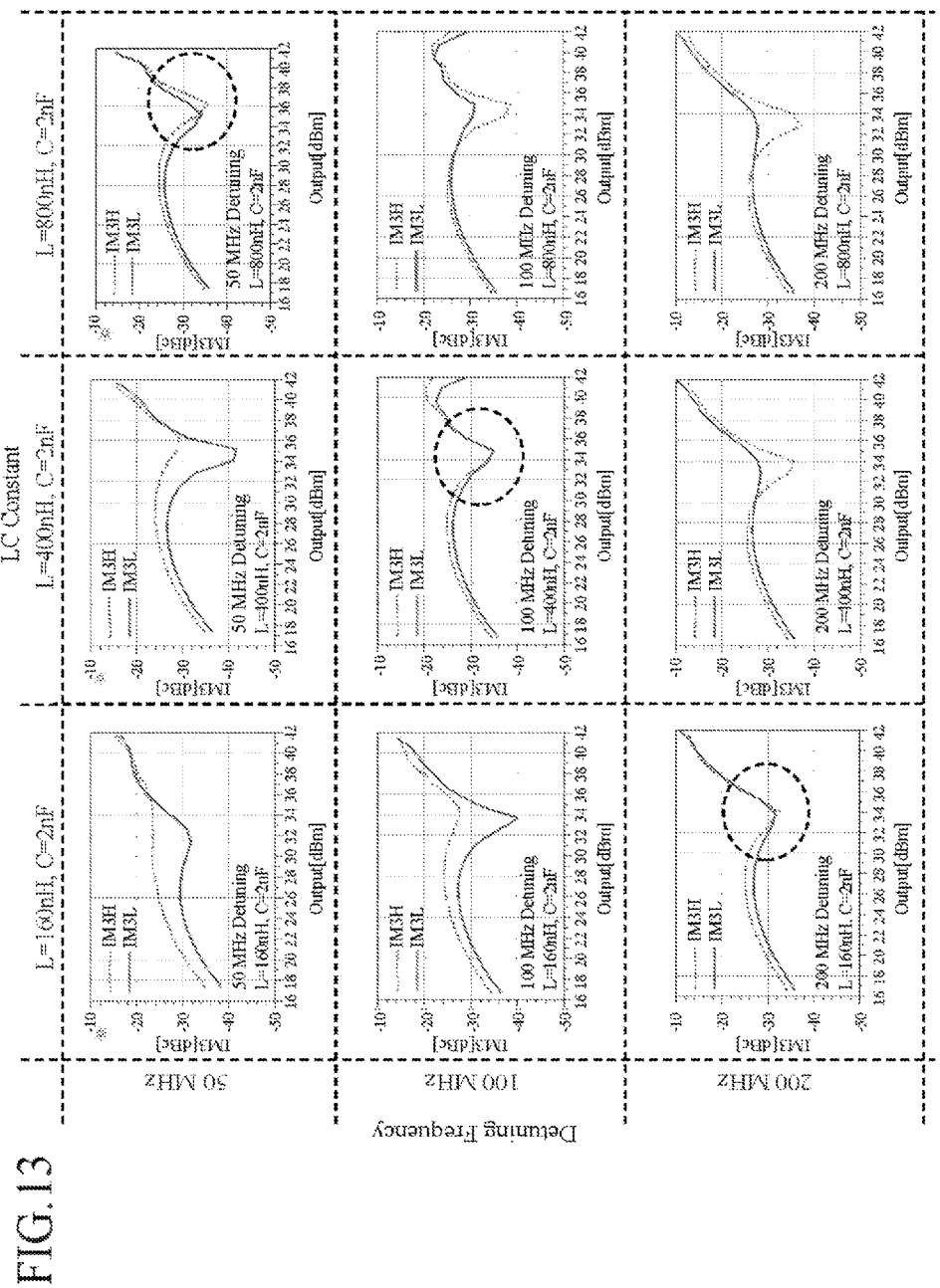
FIG. 13 is an illustrative diagram showing examples of intermodulation distortion compensation characteristics of intermodulation distortion adjustment circuits 21-1 and 21-2.

Here, FIG. 13 is an illustrative diagram showing examples of intermodulation distortion compensation characteristics of the intermodulation distortion adjustment circuits 21-1 and 21-2.

The examples of FIG. 13 show that the compensation accuracy of intermodulation distortions occurring in an amplifier is enhanced by making the inductances of the variable inductors 21a smaller as the detuning frequency ($f_2-f_1$) is wider.

In the examples of FIG. 13, the inductances of the variable inductors 21a are made smaller as the detuning frequency ($f_2-f_1$) is wider. Alternatively, the compensation accuracy of intermodulation distortions occurring in the amplifier may be enhanced by making the capacitances of the variable capacitors 21b smaller as the detuning frequency ($f_2-f_1$) is wider.

As with the intermodulation distortion adjustment circuits 9-1 and 9-2 of FIGS. 4 to 6, the intermodulation distortion adjustment circuits 21-1 and 21-2 adjust intermodulation distortions ($2f_2-f_1$, $2f_1-f_2$) appearing in signal paths 3-1 and 3-2 by reflecting difference-frequency signals ($f_2-f_1$) having passed through low-pass circuits 8-1 and 8-2 to return to the linearizer circuit 13. However, unlike the intermodulation distortion adjustment circuits 9-1 and 9-2 of FIGS. 4 to 6, the reactance is adjusted to roughly optimal values by the adjustment circuit controller 22. Therefore, intermodulation distortions ($2f_2-f_1$, $2f_1-f_2$) having opposite characteristics to intermodulation distortions occurring in the amplifier can be produced with high accuracy. As a result, the intermodulation distortions occurring in the amplifier can be compensated for with higher accuracy than the intermodulation distortion adjustment circuits 9-1 and 9-2 of FIGS. 4 to 6.

The Embodiment 12 shows an example in which, when the adjustment circuit controller 22 accepts, as input, information indicating the detuning frequency ($f_2-f_1$) of two-wave RF signals, the adjustment circuit controller 22 controls the reactance of the variable inductors 21a and the variable capacitors 21b such that the inductances of the intermodulation distortion adjustment circuits 21-1 and 21-2 become smaller as the detuning frequency ($f_2-f_1$) is wider. Alternatively, the adjustment circuit controller 22 may control, when accepting, as input, information indicating the signal band of two-wave RF signals, the reactance of the variable inductors 21a and the variable capacitors 21b such that the inductances of the intermodulation distortion adjustment circuits 21-1 and 21-2 become smaller as the signal band is wider. Also by this alternative, the compensation accuracy of intermodulation distortions occurring in the amplifier can be enhanced.

In addition, when the adjustment circuit controller 22 accepts, as input, information indicating the operating frequencies ($f_1$, $f_2$) of two-wave RF signals, the adjustment circuit controller 22 may control the inductances of the intermodulation distortion adjustment circuits 21-1 and 21-2 on a basis of the level of a center frequency of the operating frequencies ($f_1$, $f_2$), and thereby the compensation accuracy of intermodulation distortions occurring in the amplifier can be enhanced.

Embodiment 13

The above-described Embodiment 12 shows intermodulation distortion adjustment circuits 21-1 and 21-2 composed of reactance elements with variable reactance (the variable inductor 21a and the variable capacitor 21b). The Embodiment 13 discloses intermodulation distortion adjustment circuits 21-1 and 21-2 composed of a plurality of reactance elements with fixed reactance and a plurality of changeover switches that change the connection states among the plurality of reactance elements.

Figure 14:
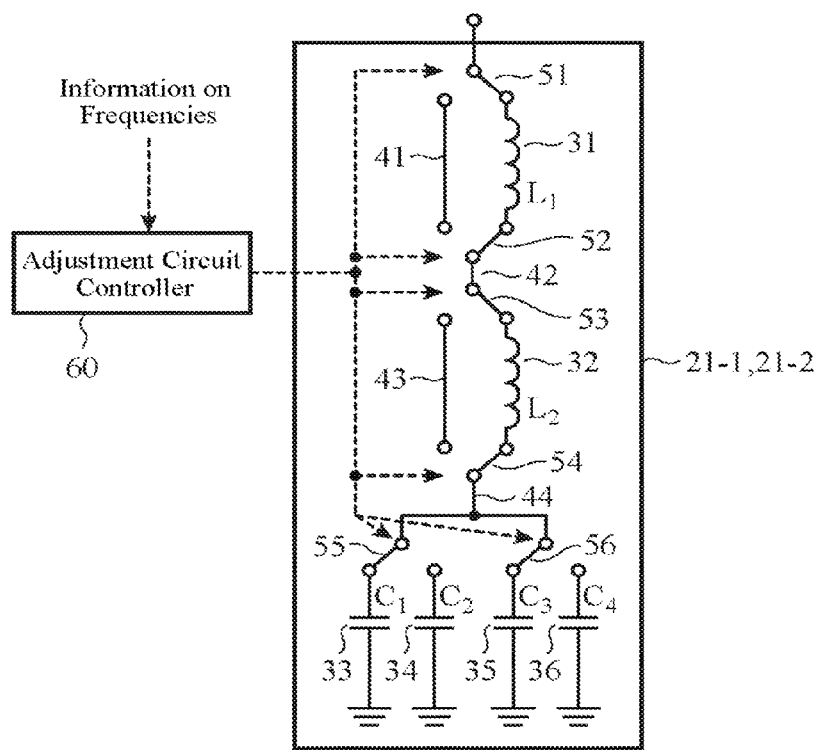
FIG. 14 is a configuration diagram showing an example of intermodulation distortion adjustment circuits 21-1 and 21-2 composed of a plurality of reactance elements with fixed reactance and a plurality of changeover switches.

FIG. 14 is a configuration diagram showing an example of the intermodulation distortion adjustment circuits 21-1 and 21-2 composed of a plurality of reactance elements with fixed reactance and a plurality of changeover switches.

In FIG. 14, an inductor 31 is a fixed reactance element with an inductance $L_1$.

An inductor 32 is a fixed reactance element with an inductance $L_2$. Note that $L_1<L_2$.

A capacitor 33 is a fixed reactance element with a capacitance $C_1$.

A capacitor 34 is a fixed reactance element with a capacitance $C_2$.

A capacitor 35 is a fixed reactance element with a capacitance $C_3$.

A capacitor 36 is a fixed reactance element with a capacitance $C_4$. Note that $C_1<C_2<C_3<C_4$.

An SPDT (Single Pole Double Throw) switch 51 is a changeover switch that connects the other end of a low-pass circuit 8-1 (or 8-2) to the inductor 31 or to a signal path 41 under the control of an adjustment circuit controller 60.

An SPDT switch 52 is a changeover switch that connects the inductor 31 or the signal path 41 to a signal path 42 under the control of the adjustment circuit controller 60.

An SPDT switch 53 is a changeover switch that connects the signal path 42 to the inductor 32 or to a signal path 43 under the control of the adjustment circuit controller 60.

An SPDT switch 54 is a changeover switch that connects the inductor 32 or the signal path 43 to a signal path 44 under the control of the adjustment circuit controller 60.

An SPDT switch 55 is a changeover switch that connects the signal path 44 to the capacitor 33 or to the capacitor 34 under the control of the adjustment circuit controller 60.

An SPDT switch 56 is a changeover switch that connects the signal path 44 to the capacitor 35 or to the capacitor 36 under the control of the adjustment circuit controller 60.

The adjustment circuit controller 60 is composed of, for example, a microcomputer, etc. The adjustment circuit controller 60 controls the reactance of the intermodulation distortion adjustment circuits 21-1 and 21-2 by controlling the SPDT switches 51 to 56 in the intermodulation distortion adjustment circuits 21-1 and 21-2 on a basis of information on the frequencies (e.g., operating frequencies, signal band, or detuning frequency) of two-wave RF signals (an RF signal with a frequency $f_1$ and an RF signal with a frequency $f_2$) which are input through an input terminal 1.

In the Embodiment 13, the intermodulation distortion adjustment circuits 9-1 and 9-2 in FIGS. 4 to 6 are replaced with the intermodulation distortion adjustment circuits 21-1 and 21-2 of FIG. 14, and the adjustment circuit controller 60 is employed.

Note that the configuration is not limited thereto. The intermodulation distortion adjustment circuits 9 in FIGS. 1 to 3 may be replaced with the intermodulation distortion adjustment circuit 21-1 of FIG. 14 along with employing the adjustment circuit controller 60. Alternatively, the intermodulation distortion adjustment circuits 16 in FIGS. 7 and 8 may be replaced with the intermodulation distortion adjustment circuit 21-1 of FIG. 14 along with employing the adjustment circuit controller 60.

Next, operation will be described.

Since process other than that of the intermodulation distortion adjustment circuits 21-1 and 21-2 and the adjustment circuit controller 60 is equivalent to the above-described Embodiment 12, the process of the intermodulation distortion adjustment circuits 21-1 and 21-2 and the adjustment circuit controller 60 will be described.

The adjustment circuit controller 60 accepts, as input, information on the frequencies (e.g., operating frequencies, signal band, or detuning frequency) of two-wave RE signals (an RF signal with the frequency $f_1$ and an RF signal with the frequency $f_2$) which are input through the input terminal 1.

The information on the frequencies of two-wave RF signals can be acquired from, for example, a signal generating apparatus such as a modem handling the two-wave RF signals.

The adjustment circuit controller 60 holds in advance correspondences between the frequencies (e.g., operating frequencies, signal bands, or detuning frequencies) of two-wave RF signals and the reactance required to obtain intermodulation distortions ($2f_2-f_1$, $2f_1-f_2$) having opposite characteristics to intermodulation distortions occurring in an amplifier. Specifically, for example, combinations between the inductors 31 to 32 and the capacitors 33 to 36 (the connection states of the SPDT switches 51 to 56) that can obtain intermodulation distortions ($2f_2-f_1$, $2f_1-f_2$) having opposite characteristics each other are recorded in a table for each detuning frequency ($f_2-f_1$) (or operating frequency or signal band).

After accepting, as input, information indicating the detuning frequency ($f_2-f_1$) of two-wave RF signals as the information on the frequencies of two-wave RF signals, the adjustment circuit controller 60 controls the SPDT switches 51 to 56 by referring to the above-described table such that, the inductances of the intermodulation distortion adjustment circuits 21-1 and 21-2 become smaller as the detuning frequency ($f_2-f_1$) is wider.

Specifically, FIG. 14 shows that, when the connection states of the SPDT switches 51 to 56 indicate that the inductors 31 and 32 are connected in series with the other end of the low-pass circuit 8-1 (or 8-2), and also the capacitors 33 and 35 are connected to the inductor 32. The shown connection states mean that the information on the detuning frequency ($f_2-f_1$) of two-wave RF signals indicates that the detuning frequency ($f_2-f_1$) is wider than that obtained at the time of the last control. On the other hand, when a combination between the inductors 31 to 32 and the capacitors 33 to 36 (i.e., the connection states of the SPDT switches 51 to 56), which is associated with the current detuning frequency ($f_2-f_1$) is a combination of the inductor 32 and the capacitors 34 and 36, the connection states of the SPDT switches 51 to 56 are changed such that the inductor 32 is connected in series with the other end of the low-pass circuit 8-1 (or 8-2) and the capacitors 34 and 36 are connected to the inductor 32.

As with the intermodulation distortion adjustment circuits 9-1 and 9-2 of FIGS. 4 to 6, the intermodulation distortion adjustment circuits 21-1 and 21-2 adjust intermodulation distortions ($2f_2-f_1$, $2f_1-f_2$) appearing in signal paths 3-1 and 3-2 by reflecting difference-frequency signals ($f_2-f_1$) having passed through the low-pass circuits 8-1 and 8-2 to return to the linearizer circuit 13. However, unlike the intermodulation distortion adjustment circuits 9-1 and 9-2 of FIGS. 4 to 6, the reactance is adjusted to roughly optimal values by the adjustment circuit controller 60. Therefore, intermodulation distortions ($2f_2-f_1$, $2f_1-f_2$) having opposite characteristics to intermodulation distortions occurring in the amplifier can be produced with high accuracy. As a result, the intermodulation distortions occurring in the amplifier can be compensated for with higher accuracy than the intermodulation distortion adjustment circuits 9-1 and 9-2 of FIGS. 4 to 6.

Although the Embodiment 13 shows an example in which, when the adjustment circuit controller 60 accepts, as input, information indicating the detuning frequency ($f_2-f_1$) of two-wave RF signals, the adjustment circuit controller 60 controls the switching of the SPDT switches 51 to 56 such that the inductances of the intermodulation distortion adjustment circuits 21-1 and 21-2 become smaller as the detuning frequency ($f_2-f_1$) is wider. Alternatively, the adjustment circuit controller 60 may control, when accepting, as input, information indicating the signal band of two-wave RF signals, the switching of the SPDT switches 51 to 56 such that the inductances of the intermodulation distortion adjustment circuits 21-1 and 21-2 become smaller as the signal band is wider. Also by this alternative, the compensation accuracy of intermodulation distortions occurring in the amplifier can be enhanced.

In addition, when the adjustment circuit controller 60 accepts, as input, information indicating the operating frequencies ($f_2$, $f_1$) of two-wave RF signals, the adjustment circuit controller 60 may control the SPDT switches 51 to 56 on a basis of the level of a center frequency of the operating frequencies ($f_2$, $f_1$), and thereby the compensation accuracy of intermodulation distortions occurring in the amplifier can be enhanced.

Embodiment 14

The above-described Embodiment 13 describes a configuration in which an adjustment circuit controller 60 can change both an inductive component and a capacitive component among the inductances of intermodulation distortion adjustment circuits 21-1 and 21-2. Alternatively, intermodulation distortions occurring in an amplifier may be compensated for by changing either one of the inductive component and the capacitive component.

Figure 15:
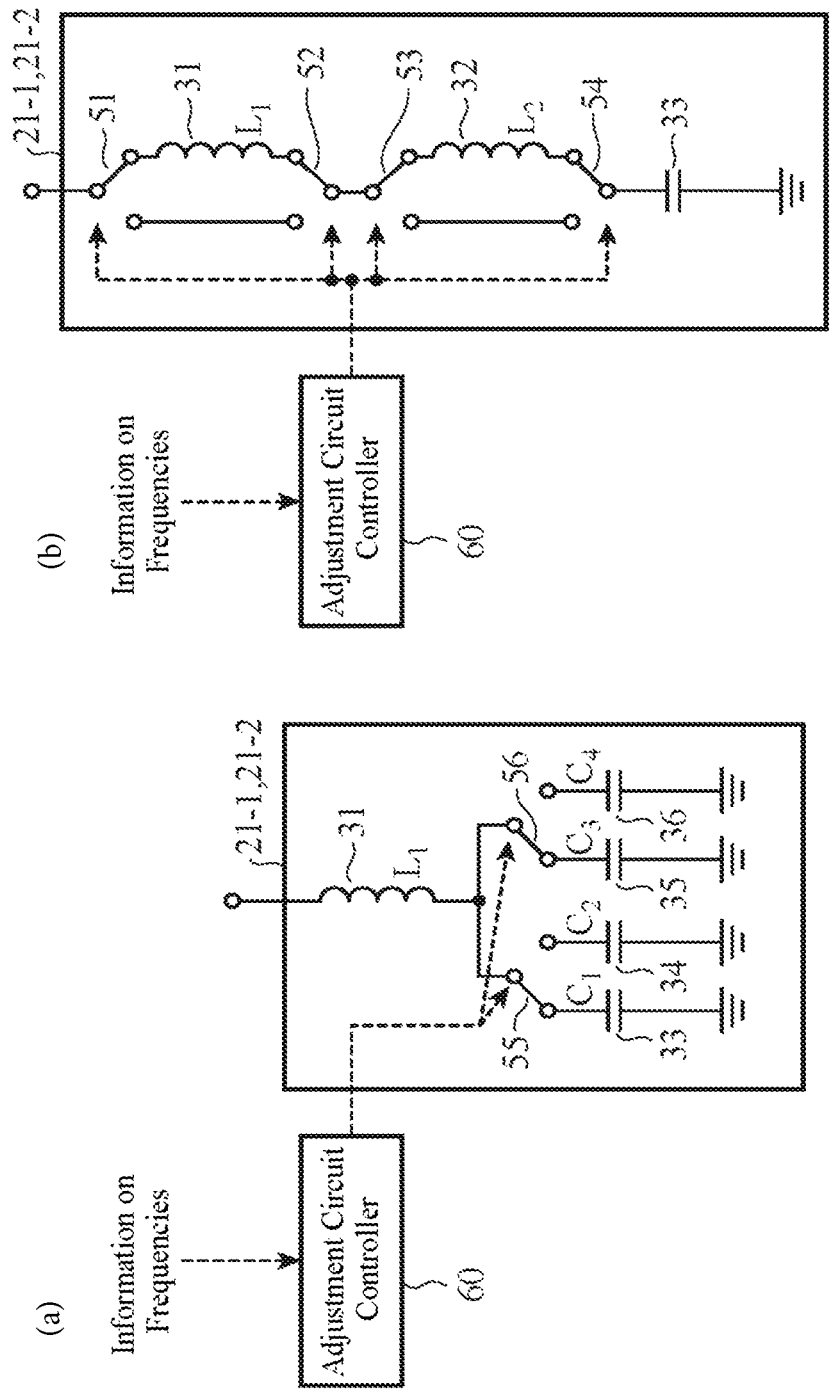
FIGS. 15A to 15B are configuration diagrams each of which shows an example of intermodulation distortion adjustment circuits 21-1 and 21-2 composed of a plurality of reactance elements with fixed reactance and a plurality of changeover switches.

FIGS. 15A-15B are configuration diagrams each of which shows an example of intermodulation distortion adjustment circuits 21-1 and 21-2 composed of a plurality of reactance elements with fixed reactance and a plurality of changeover switches.

FIG. 15A shows an exemplary configuration in which a capacitive component is changed by switching connections of an inductor 31 to capacitors 33-36. Although in FIG. 15A the inductor 31 is mounted, this inductor 31 can be removed when an inductive component is not necessary.

FIG. 15B shows an exemplary configuration in which an inductive component is changed by switching between inductors 31 and 32 to be connected in series with the other end of a low-pass circuit 8-1 (or 8-2). In FIG. 15B, the capacitor 33 is provided as a DC-cut capacitor.

Embodiment 15

The above-described Embodiments 1 to 11 show that the low-pass circuit 8 or 8-1, 8-2) is connected in series with the intermodulation distortion adjustment circuit 9 (or 9-1, 9-2, 16). Alternatively, a band-pass filter may be connected between the low-pass circuit 8 (or 8-1, 8-2) and the intermodulation distortion adjustment circuit 9 (or 9-1, 9-2, 16), and also a plurality of sets of the intermodulation distortion adjustment circuit 9 (or 9-1, 9-2, 16) and the band-pass filter may be provided.

Figure 16:
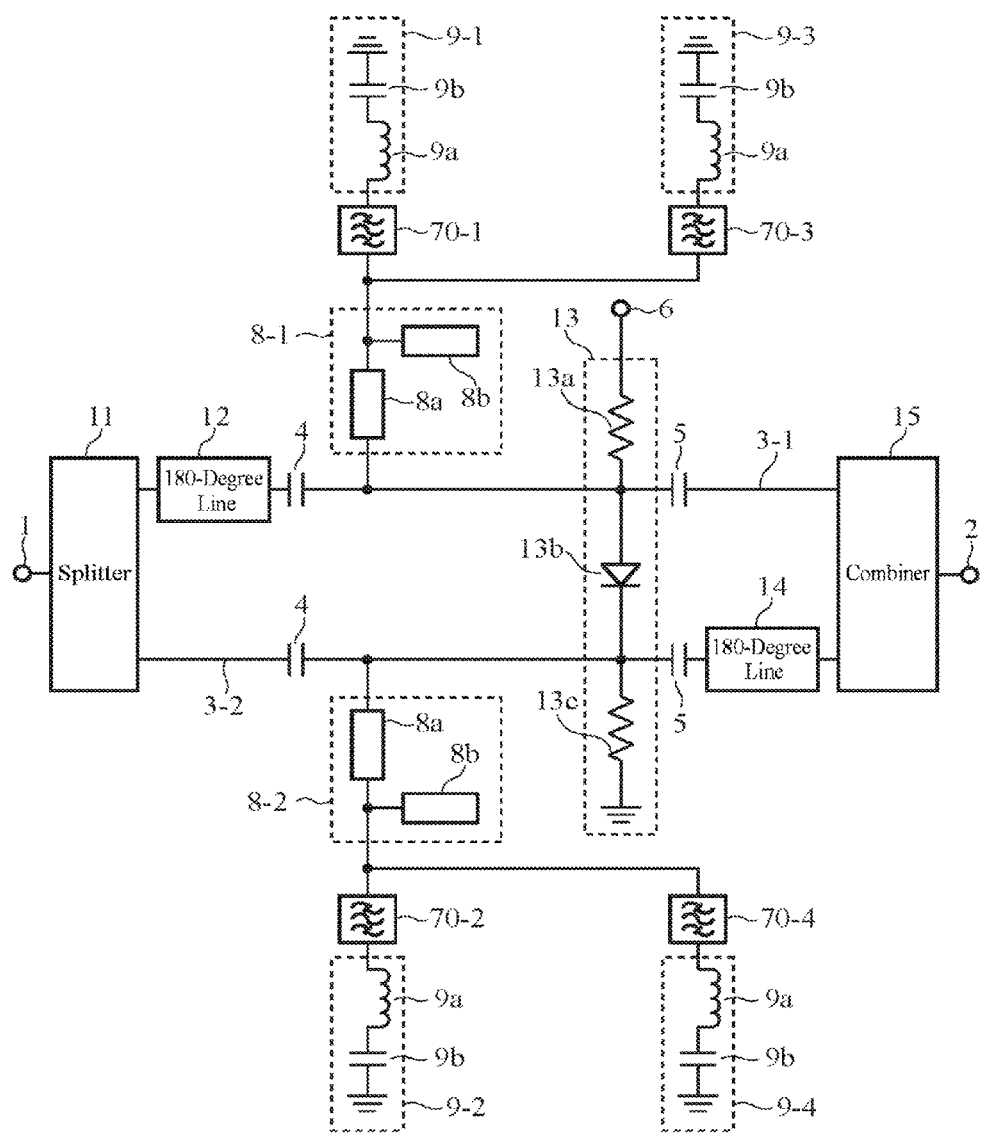
FIG. 16 is a configuration diagram showing a distortion compensation circuit of Embodiment 15 of the invention.

FIG. 16 is a configuration diagram showing a distortion compensation circuit of Embodiment 15 of the invention. In FIG. 16, the same reference signs as those in FIGS. 4 to 6 indicate the same or corresponding portions and thus description thereof is omitted.

As with the intermodulation distortion adjustment circuit 9-1, an intermodulation distortion adjustment circuit 9-3 is a circuit that is connected between the other end of a low-pass circuit 8-1 and a ground. The intermodulation distortion adjustment circuit 9-3 adjusts intermodulation distortions ($2f_2-f_1$, $2f_1-f_2$) appearing in a signal path 3-1 by reflecting a difference-frequency signal ($f_2-f_1$) having passed through the low-pass circuit 8-1 to return to a linearizer circuit 13.

As with the intermodulation distortion adjustment circuit 9-2, an intermodulation distortion adjustment circuit 9-4 is a circuit that is connected between the other end of a low-pass circuit 8-2 and a ground. The intermodulation distortion adjustment circuit 9-4 adjusts intermodulation distortions ($2f_2-f_1$, $2f_1-f_2$) appearing in a signal path 3-2 by reflecting a difference-frequency signal ($f_2-f_1$) having passed through the low-pass circuit 8-2 to return to the linearizer circuit 13.

A band-pass filter 70-1 as a first band-pass filter is connected between the low-pass circuit 8-1 and the intermodulation distortion adjustment circuit 9-1. The band-pass filter 70-1 allows the passage of the difference-frequency signal ($f_2-f_1$) having passed through the low-pass circuit 8-1.

A band-pass filter 70-3 as a first band-pass filter is connected between the low-pass circuit 8-1 and the intermodulation distortion adjustment circuit 9-3. The band-pass filter 70-3 allows the passage of the difference-frequency signal ($f_2-f_1$) having passed through the low-pass circuit 8-1.

The band-pass filters 70-1 and 70-3 both compose the first band-pass filters but have different center frequencies from each other.

A band-pass filter 70-2 as a second band-pass filter is connected between the low-pass circuit 8-2 and the intermodulation distortion adjustment circuit 9-2. The band-pass filter 70-2 allows the passage of the difference-frequency signal ($f_2-f_1$) having passed through the low-pass circuit 8-2.

A band-pass filter 70-4 as a second band-pass filter is connected between the low-pass circuit 8-2 and the intermodulation distortion adjustment circuit 9-4. The band-pass filter 70-4 allows the passage of the difference-frequency signal ($f_2-f_1$) having passed through the low-pass circuit 8-2.

The band-pass filters 70-2 and 70-4 both compose the second band-pass filters but have different center frequencies from each other.

Next, operation will be described.

The basic operation of the distortion compensation circuit of FIG. 16 is equivalent to that of a distortion compensation circuit of FIG. 4 in the above-described Embodiment 4.

Note that the intermodulation distortion adjustment circuits 9-1 and 9-3 are provided as first intermodulation distortion adjustment circuits, and the intermodulation distortion adjustment circuits 9-2 and 9-4 are provided as second intermodulation distortion adjustment circuits. Also note that the distortion compensation circuit of FIG. 16 differs configuration-wise from the distortion compensation circuit of FIG. 4 in the above-described Embodiment 4 in that, the band-pass filters 70-1 and 70-3 are provided between the low-pass circuit 8-1 and the intermodulation distortion adjustment circuits 9-1 and 9-3, and also the band-pass filters 70-2 and 70-4 are provided between the low-pass circuit 8-2 and the intermodulation distortion adjustment circuits 9-2 and 9-4.

In the Embodiment 15, the band-pass filters 70-1 and 70-3 have different center frequencies and the band-pass filters 70-2 and 70-4 have different center frequencies.

Specifically, it is assumed that the low-pass circuits 8-1 and 8-2 are configured to allow the passage of difference-frequency signals ($f_2-f_1$) of 500 MHz or less, and also assumed that the center frequencies of the band-pass filters 70-1 and 70-2 are set to 50 MHz and the center frequencies of the band-pass filters 70-3 and 70-4 are set to 100 MHz. In this case, among difference-frequency signals ($f_2-f_1$) having passed through the low-pass circuits 8-1 and 8-2, difference-frequency signals ($f_2-f_1$) passing through the band-pass filters 70-1 and 70-3 are signals near 50 MHz, and difference-frequency signals ($f_2-f_1$) that pass through the band-pass filters 70-2 and 70-4 are signals near 100 MHz.

Therefore, if the reactance of the intermodulation distortion adjustment circuits 9-1 and 9-3 are adjusted to handle the difference-frequency signals ($f_2-f_1$) near 50 MHz and also the reactance of the intermodulation distortion adjustment circuits 9-2 and 9-4 are adjusted to handle difference-frequency signals ($f_2-f_1$) near 100 MHz, intermodulation distortions ($2f_2-f_1$, $2f_1-f_2$) having opposite characteristics to intermodulation distortions occurring in an amplifier can be generated with high accuracy over a wider band than when only the intermodulation distortion adjustment circuit 9-1 and the intermodulation distortion adjustment circuit 9-2 are provided, enabling to enhance the compensation accuracy of the intermodulation distortions occurring in the amplifier.

The Embodiment 15 shows an example in which four sets of the band-pass filters 70-1 to 70-4 and the intermodulation distortion adjustment circuits 9-1 to 9-4 are loaded. Alternatively, more sets of a band-pass filter and an intermodulation distortion adjustment circuit may be loaded. Also by this alternative, the compensation accuracy of intermodulation distortions occurring in the amplifier can be enhanced for a further wider band.

Figure 17:
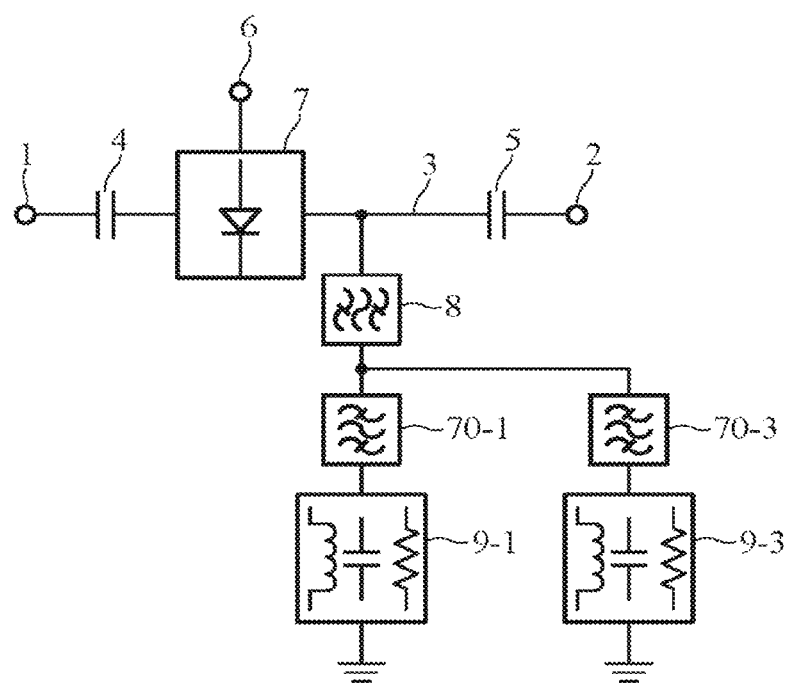
FIG. 17 is a configuration diagram showing a distortion compensation circuit of the Embodiment 15 of the invention.

The Embodiment 15 shows an example in which the band-pass filters 70-1 to 70-4 are applied to distortion compensation circuits of FIGS. 4 to 6. Alternatively, the band-pass filters 70-1 and 70-3 may be applied to distortion compensation circuits of FIGS. 1 to 3 and the same effect can be provided (see FIG. 17).

Figure 18:
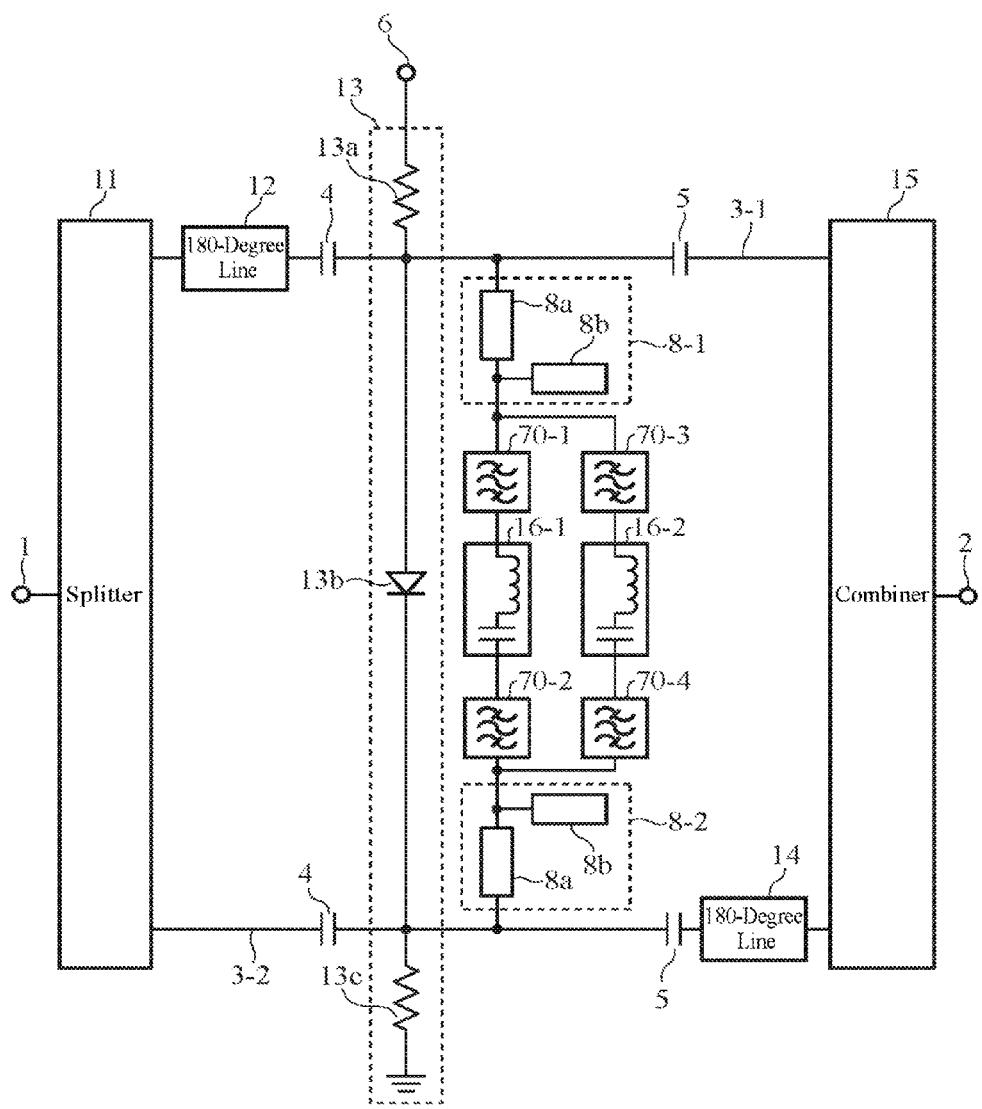
FIG. 18 is a configuration diagram showing a distortion compensation circuit of the Embodiment 15 of the invention.
Figure 19:
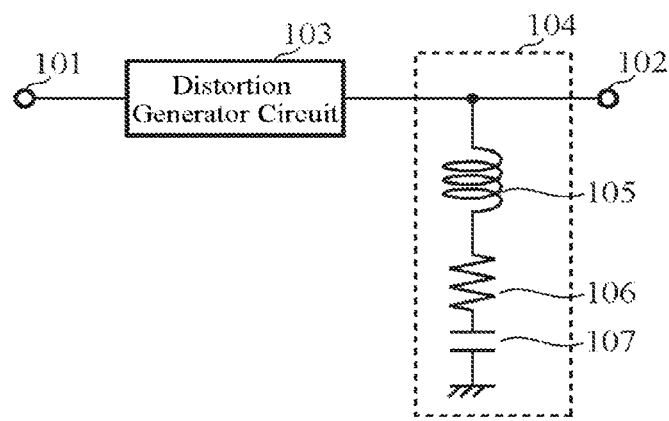
FIG. 19 is a configuration diagram showing a distortion compensation circuit disclosed in Patent Literature 1
Figure 20:
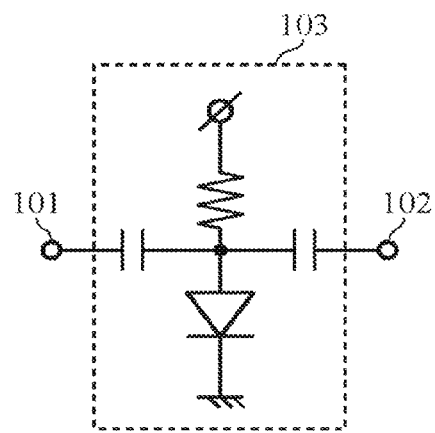
FIG. 20 is a configuration diagram showing a distortion generator circuit in the distortion compensation circuit of FIG. 19.

In addition, the band-pass filters 70-1 to 70-4 may be applied to distortion compensation circuits of FIGS. 7 and 8, and thereby the same effect can be provided (see FIG. 18). In FIG. 18, intermodulation distortion adjustment circuits 16-1 and 16-2 are circuits corresponding to an intermodulation distortion adjustment circuit 16.

The Embodiment 15 shows an example in which the band-pass filters 70-1 and 70-3 are connected between the low-pass circuit 8-1 and the intermodulation distortion adjustment circuits 9-1 and 9-3. Alternatively, the band-pass filters 70-2 and 70-4 are connected between the low-pass circuit 8-2 and the intermodulation distortion adjustment circuits 9-2 and 9-4, the intermodulation distortion adjustment circuits 9-1 to 9-4 may be replaced by intermodulation distortion adjustment circuits shown in FIG. 12 or 14 and an adjustment circuit controller 22 or an adjustment circuit controller 60 may be applied, and thereby the same effect can be provided.

Note that free combinations of the embodiments, or modifications to any component in the embodiments, or omissions of any component in the embodiments which fall within the spirit and scope of the claimed invention may be made to the invention of the present application.

Distortion compensation circuits on a basis of the invention are configured such that a low-pass circuit that blocks the passage of a plurality of radio frequency signals and intermodulation distortions generated by a linearizer circuit and that allows the passage of a difference-frequency signal is connected between a signal path and an intermodulation distortion adjustment circuit. Therefore, even if the intermodulation distortion adjustment circuit is composed using an inexpensive inductor and capacitor having low self-resonant frequencies, intermodulation distortions appearing in a signal path can be adjusted without affecting RF characteristics. Accordingly, the distortion compensation circuits are suitable to accurately compensate for intermodulation distortions occurring in an amplifier.

REFERENCE SIGNS LIST

1: Input terminal, 2: Output terminal, 3: Signal path, 3-1: Signal path (first signal path), 3-2: Signal path (second signal path), 4 and 5: DC-cut capacitor, 6: DC terminal, 7: Linearizer circuit, 7a: Resistor, 7b: Diode, 8: Low-pass circuit, 8-1: Low-pass circuit (first low-pass circuit), 8-2: Low-pass circuit (second low-pass circuit), 8a: Transmission line, 8b: Open stub, 8c: High-frequency inductor, 8d: High-frequency capacitor, 9: Intermodulation distortion adjustment circuit, 9-1 and 9-3: Intermodulation distortion adjustment circuit (first intermodulation distortion adjustment circuit), 9-2 and 9-4: Intermodulation distortion adjustment circuit (second intermodulation distortion adjustment circuit), 9a: Low-frequency inductor, 9b: Low-frequency capacitor, 9c: Low-frequency resistor, 10: Harmonic impedance adjustment circuit, 10-1: Harmonic impedance adjustment circuit (first harmonic impedance adjustment circuit), 10-2: Harmonic impedance adjustment circuit (second harmonic impedance adjustment circuit), 10a: Harmonic open stub, 10b: DC-cut high-frequency capacitor, 10c: Transmission line, 10d: Harmonic inductance, 11: Splitter (differential signal converter), 12: 180-degree line (differential signal converter), 13, 13-1, and 13-2: Linearizer circuit, 13a: Resistor, 13b: Diode, 13c: Resistor, 14: 180-degree line (single-phase signal converter), 15: Combiner (single-phase signal converter), 16, 16-1, and 16-2: Intermodulation distortion adjustment circuit, 16a: Inductor, 16b: Capacitor, 21-1 and 21-2: Intermodulation distortion adjustment circuit, 21a: Variable inductor (variable reactance element), 21b: Variable capacitor (variable reactance element), 22: Adjustment circuit controller, 31 and 32: Inductor (fixed reactance element), 33 to 36: Capacitor (fixed reactance element), 41 to 44: Signal path, 51 to 56: SPDT switch (changeover switch), 60: Adjustment circuit controller, 70-1 and 70-3: Band-pass filter (first band-pass filter), 70-2 and 70-4: Band-pass filter (second band-pass filter), 101: Input terminal, 102: Output terminal, 103: Distortion generator circuit, 104: Impedance conversion circuit, 105: Inductance, 106: Resistor, and 107: Capacitor

The invention claimed is:

1. A distortion compensation circuit that compensates for intermodulation distortions occurring in the amplifier by generating intermodulation distortions which have opposite characteristics to the intermodulation distortions occurring in the amplifier, the amplifier being connected to a stage previous to an input terminal of a signal path or to a stage subsequent to an output terminal of the signal path, the distortion compensation circuit comprising:
  a linearizer circuit to generate, in response to an input of a plurality of radio frequency signals through the input terminal, a difference-frequency signal and intermodulation distortions of the radio frequency signals, the linearizer circuit being inserted in the signal path;
  a low-pass circuit to block passage of the radio frequency signals and the intermodulation distortions generated by the linearizer circuit and to allow passage of the difference-frequency signal, one end of the low-pass circuit being connected to the signal path; and
  an intermodulation distortion adjustment circuit to adjust intermodulation distortions appearing in the signal path by reflecting the difference-frequency signal having passed through the low-pass circuit to return to the linearizer circuit, the intermodulation distortion adjustment circuit being connected between another end of the low-pass circuit and a ground,
  wherein
  the linearizer circuit includes a diode and a resistor, the diode being connected between the signal path and a ground, the resistor being connected between a DC terminal and the signal path,
  the low-pass circuit includes a transmission line whose one end is connected to the signal path and another end is connected to the intermodulation distortion adjustment circuit, and an open stub whose one end is connected to the transmission line, each of the transmission line and the open stub having a length of a quarter wavelength at a center frequency of the radio frequency signals, and
  the intermodulation distortion adjustment circuit includes a reactance element.

2. The distortion compensation circuit according to claim 1, wherein the intermodulation distortion adjustment circuit adjusts an impedance of the difference-frequency signal such that the intermodulation distortions appearing in the signal path have opposite characteristics to the intermodulation distortions occurring in the amplifier.

3. The distortion compensation circuit according to claim 1, further comprising a harmonic impedance adjustment circuit to adjust the intermodulation distortions appearing in the signal path by reflecting harmonic components of the radio frequency signals generated by the linearizer circuit to return to the linearizer circuit, one end of the harmonic impedance adjustment circuit being connected to the signal path,
  wherein the harmonic impedance adjustment circuit adjusts impedances of the harmonic components such that the intermodulation distortions appearing in the signal path have opposite characteristics to the intermodulation distortions occurring in the amplifier.

4. A distortion compensation circuit that compensates for intermodulation distortions occurring in the amplifier by generating intermodulation distortions which have opposite characteristics to the intermodulation distortions occurring in the amplifier, the amplifier being connected to a stage previous to an input terminal of differential signal paths or to a stage subsequent to an output terminal of the differential signal paths, the differential signal paths including a first signal path and a second signal path, the distortion compensation circuit comprising:
  a differential signal converter to convert radio frequency signals, which are input through the input terminal and have different frequencies, into a pair of differential signals, and outputs first radio frequency signals to the first signal path as one part of the differential signals and outputs second radio frequency signals to the second signal path as another part of the differential signals;

a linearizer circuit to generate, on the first signal path, a difference-frequency signal and intermodulation distortions of the first radio frequency signals in response to an input of the first radio frequency signals, and to generate, on the second signal path, a difference-frequency signal and intermodulation distortions of the second radio frequency signals in response to an input of the second radio frequency signals, the linearizer circuit being inserted in the differential signal paths;

a first low-pass circuit to block passage of the first radio frequency signals and the intermodulation distortions generated on the first signal path and to allow passage of the difference-frequency signal generated on the first signal path, one end of the first low-pass circuit being connected to the first signal path;

a second low-pass circuit to block passage of the second radio frequency signals and the intermodulation distortions generated on the second signal path and to allow passage of the difference-frequency signal generated on the second signal path, one end of the second low-pass circuit being connected to the second signal path;

a first intermodulation distortion adjustment circuit to adjust intermodulation distortions appearing in the first signal path by reflecting the difference-frequency signal having passed through the first low-pass circuit to return to the linearizer circuit, the first intermodulation distortion adjustment circuit being connected between another end of the first low-pass circuit and a ground;

a second intermodulation distortion adjustment circuit to adjust intermodulation distortions appearing in the second signal path by reflecting the difference-frequency signal having passed through the second low-pass circuit to return to the linearizer circuit, the second intermodulation distortion adjustment circuit being connected between another end of the second low-pass circuit and a ground; and a single-phase signal converter to convert the differential signals having been transmitted on the first and second signal paths into single-phase signals, wherein the linearizer circuit includes a diode, a first resistor and a second resistor, the diode being connected between the first and second signal paths, the first resistor being connected between the first signal path and a DC terminal, the second resistor being connected between the second signal path and the ground, the first low-pass circuit includes a first transmission line whose one end is connected to the first signal path and another end is connected to the first intermodulation distortion adjustment circuit, and a first open stub whose one end is connected to said another end of the first transmission line, each of the first transmission line and the first open stub having a length of a quarter wavelength at a center frequency of the first radio frequency signals, the first intermodulation distortion adjustment circuit includes a first reactance element, the second low-pass circuit includes a second transmission line whose one end is connected to the second signal path and another end is connected to the second intermodulation distortion adjustment circuit, and a second open stub whose one end is connected to said another end of the second transmission line, each of the second transmission line and the second open stub having a length of a quarter wavelength at a center frequency of the second radio frequency signals, and the second intermodulation distortion adjustment circuit includes a second reactance element.

5. The distortion compensation circuit according to claim 4, wherein the first intermodulation distortion adjustment circuit adjusts an impedance of the difference-frequency signal generated on the first signal path such that the intermodulation distortions appearing in the first signal path have opposite characteristics to the intermodulation distortions occurring in the amplifier, and the second intermodulation distortion adjustment circuit adjusts an impedance of the difference-frequency signal generated on the second signal path such that the intermodulation distortions appearing in the second signal path have opposite characteristics to the intermodulation distortions occurring in the amplifier.

6. A distortion compensation circuit that compensates for intermodulation distortions occurring in the amplifier by generating intermodulation distortions which have opposite characteristics to the intermodulation distortions occurring in the amplifier, the amplifier being connected to a stage previous to an input terminal of differential signal paths or to a stage subsequent to an output terminal of the differential signal paths, the differential signal paths including a first signal path and a second signal path, the distortion compensation circuit comprising:

a differential signal converter to convert radio frequency signals, which are input through the input terminal and have different frequencies, into a pair of differential signals, and outputs first radio frequency signals to the first signal path as one part of the differential signals and outputs second radio frequency signals to the second signal path as another part of the differential signals;

a linearizer circuit to generate, on the first signal path, a difference-frequency signal and intermodulation distortions of the first radio frequency signals in response to an input of the first radio frequency signals, and to generate, on the second signal path, a difference-frequency signal and intermodulation distortions of the second radio frequency signals in response to an input of the second radio frequency signals, the linearizer circuit being inserted in the differential signal paths;

a first low-pass circuit to block passage of the first radio frequency signals and the intermodulation distortions generated on the first signal path and to allow passage of the difference-frequency signal generated on the first signal path, one end of the first low-pass circuit being connected to the first signal path;

a second low-pass circuit to block passage of the second radio frequency signals and the intermodulation distortions generated on the second signal path and to allow passage of the difference-frequency signal generated on the second signal path, one end of the second low-pass circuit being connected to the second signal path;

an intermodulation distortion adjustment circuit to adjust intermodulation distortions appearing in the first and second signal paths by reflecting the difference-frequency signal having passed through the first low-pass circuit to return to the linearizer circuit and also reflecting the difference-frequency signal having passed through the second low-pass circuit to return to the linearizer circuit, the intermodulation distortion adjustment circuit being connected between another end of the first low-pass circuit and another end of the second low-pass circuit; and a single-phase signal converter to convert the differential signals having been transmitted through the first and second signal paths into single-phase signals, wherein the linearizer circuit includes a diode, a first resistor and a second resistor, the diode being connected between the first and second signal paths, the first resistor being connected between the first signal path and a DC terminal, the second resistor being connected between the second signal path and the ground, the first low-pass circuit includes a first transmission line whose one end is connected to the first signal path and another end is connected to one end of the intermodulation distortion adjustment circuit, and a first open stub whose one end is connected to said another end of the first transmission line, each of the first transmission line and the first open stub having a length of a quarter wavelength at a center frequency of the first radio frequency signals, the second low-pass circuit includes a second transmission line whose one end is connected to the second signal path and another end is connected to another end of the intermodulation distortion adjustment circuit, and a second open stub whose one end is connected to said another end of the second transmission line, each of the second transmission line and the second open stub having a length of a quarter wavelength at a center frequency of the second radio frequency signals, and the intermodulation distortion adjustment circuit includes a reactance element.

7. The distortion compensation circuit according to claim 6, wherein the intermodulation distortion adjustment circuit adjusts impedances of the difference-frequency signals generated on the first and second signal paths such that the intermodulation distortions appearing in the first and second signal paths have opposite characteristics to the intermodulation distortions occurring in the amplifier.

8. The distortion compensation circuit according to claim 4, further comprising:

a first harmonic impedance adjustment circuit to adjust the intermodulation distortions appearing in the first signal path by reflecting a harmonic component of the first radio frequency signals occurring in the first signal path to return to the linearizer circuit, one end of the first harmonic impedance adjustment circuit being connected to the first signal path; and a second harmonic impedance adjustment circuit to adjust the intermodulation distortions appearing in the second signal path by reflecting a harmonic component of the second radio frequency signals occurring in the first signal path to return to the linearizer circuit, one end of the second harmonic impedance adjustment circuit being connected to the second signal path, wherein the first and second harmonic impedance adjustment circuits adjust impedances of the harmonic components of the first and second radio frequency signal such that combined waves of the intermodulation distortions appearing in the first and second signal paths have opposite characteristics to the intermodulation distortions occurring in the amplifier.

9. The distortion compensation circuit according to claim 6, further comprising:

a first harmonic impedance adjustment circuit to adjust the intermodulation distortions appearing in the first signal path by reflecting a harmonic component of the first radio frequency signals occurring in the first signal path to return to the linearizer circuit, one end of the first harmonic impedance adjustment circuit being connected to the first signal path; and a second harmonic impedance adjustment circuit to adjust the intermodulation distortions appearing in the second signal path by reflecting a harmonic component of the second radio frequency signals occurring in the first signal path to return to the linearizer circuit, one end of the second harmonic impedance adjustment circuit being connected to the second signal path, wherein the first and second harmonic impedance adjustment circuits adjust impedances of the harmonic components of the first and second radio frequency signal such that combined waves of the intermodulation distortions appearing in the first and second signal paths have opposite characteristics to the intermodulation distortions occurring in the amplifier.

10. The distortion compensation circuit according to claim 4, wherein the linearizer circuit is connected in a manner of multistage on the differential signal paths.

11. The distortion compensation circuit according to claim 6, wherein the linearizer circuit is connected in a manner of multistage on the differential signal paths.

12. The distortion compensation circuit according to claim 1, wherein the intermodulation distortion adjustment circuit includes a circuit with variable reactance, and the distortion compensation circuit further comprises a controller to control a reactance of the intermodulation distortion adjustment circuit on a basis of information on frequencies of the radio frequency signals input through the input terminal.

13. The distortion compensation circuit according to claim 6, wherein the intermodulation distortion adjustment circuit includes a circuit with variable reactance, and the distortion compensation circuit further comprises a controller to control a reactance of the intermodulation distortion adjustment circuit on a basis of information on frequencies of the radio frequency signals input through the input terminal.

14. The distortion compensation circuit according to claim 4, wherein each of the first and second intermodulation distortion adjustment circuits includes a circuit with first variable reactance and a circuit with second variable reactance, respectively, and the distortion compensation circuit comprises a controller to control the first and second variable reactance of the first and second intermodulation distortion adjustment circuits on a basis of information on frequencies of the radio frequency signals input through the input terminal.

15. The distortion compensation circuit according to claim 12, wherein the circuit with variable reactance includes a reactance element with variable reactance, and the controller controls the reactance of the reactance element on a basis of the information on frequencies of the radio frequency signals input through the input terminal.

16. The distortion compensation circuit according to claim 13, wherein the circuit with variable reactance includes a reactance element with variable reactance, and the controller controls the reactance of the reactance element on a basis of the information on frequencies of the radio frequency signals input through the input terminal.

17. The distortion compensation circuit according to claim 14, wherein
each of the circuits with the first and second variable reactance includes a reactance element with variable reactance, and
the controller controls the reactance of the reactance element on a basis of the information on frequencies of the radio frequency signals input through the input terminal.

18. The distortion compensation circuit according to claim 12, wherein
the circuit with variable reactance includes a plurality of reactance elements with fixed reactance and a plurality of changeover switches to change a connection states among the plurality of reactance elements, and
the controller controls the changeover switches on a basis of the information on frequencies of the radio frequency signals input through the input terminal.

19. The distortion compensation circuit according to claim 13, wherein
the circuit with variable reactance includes a plurality of reactance elements with fixed reactance and a plurality of changeover switches to change a connection states among the plurality of reactance elements, and
the controller controls the changeover switches on a basis of the information on frequencies of the radio frequency signals input through the input terminal.

20. The distortion compensation circuit according to claim 14, wherein
each of the circuits with the first and second variable reactance includes a plurality of reactance elements with fixed reactance and a plurality of changeover switches to change a connection states among the plurality of reactance elements, and
the controller controls the changeover switches on a basis of the information on frequencies of the radio frequency signals input through the input terminal.

21. The distortion compensation circuit according to claim 1, further comprising a band-pass filter to allow passage of the difference-frequency signal, the band-pass filter being connected between the low-pass circuit and the intermodulation distortion adjustment circuit,
wherein plural sets of the intermodulation distortion adjustment circuit and the band-pass filter are provided in the distortion compensation circuit, the band-pass filters having different center frequencies from each other.

22. The distortion compensation circuit according to claim 4, further comprising: a first band-pass filter to allow passage of the difference-frequency signal generated on the first signal path, the first band-pass filter being connected between the first low-pass circuit and the first intermodulation distortion adjustment circuit; and a second band-pass filter to allow passage of the difference-frequency signal generated on the second signal path, the second band-pass filter being connected between the second low-pass circuit and the second intermodulation distortion adjustment circuit,
wherein plural sets of the first intermodulation distortion adjustment circuit and the first band-pass filter are provided in the distortion compensation circuit, and plural sets of the second intermodulation distortion adjustment circuit and the second band-pass filter are provided in the distortion compensation circuit, the first band-pass filters in the plural sets having different center frequencies from each other, the second band-pass filters in the plural sets have different center frequencies from each other.

23. The distortion compensation circuit according to claim 6, further comprising: a first band-pass filter to allow passage of the difference-frequency signal generated on the first signal path, the first band-pass filter being connected between the first low-pass circuit and the intermodulation distortion adjustment circuit; and a second band-pass filter to allow passage of the difference-frequency signal generated on the second signal path, the second band-pass filter being connected between the second low-pass circuit and the intermodulation distortion adjustment circuit,
wherein plural sets of the intermodulation distortion adjustment circuit and the first and second band-pass filter are provided in the distortion compensation circuit, the first band-pass filters in the plural sets having different center frequencies from each other, the second band-pass filters in the plural sets having different center frequencies from each other.

* * * * *